United States Patent [19]

Maekawa et al.

[11] Patent Number: 5,434,869
[45] Date of Patent: Jul. 18, 1995

[54] TEST PATTERN GENERATING APPARATUS

[75] Inventors: Hidetsugu Maekawa, Kadoma; Yasuharu Shimeki, Suita; Kazuhiro Kayashima, Hirakata; Hisao Niwa, Osaka; Seiichi Shin, Tsukuba, all of Japan

[73] Assignee: Matsushita Electric Industrial Co., Ltd., Osaka, Japan

[21] Appl. No.: 938,007

[22] Filed: Aug. 28, 1992

[30] Foreign Application Priority Data

Aug. 30, 1991 [JP] Japan .................. 3-219890
Oct. 31, 1991 [JP] Japan .................. 3-285918
Jan. 27, 1992 [JP] Japan .................. 4-011776

[51] Int. Cl.⁶ .................. G06F 11/00; G01R 31/28
[52] U.S. Cl. .................. 371/27; 371/15.1; 364/579
[58] Field of Search .................. 371/27, 22.1, 15.1; 364/579; 324/73.1, 158 R

[56] References Cited

U.S. PATENT DOCUMENTS 4,317,200  2/1982  Wakatsuki et al. .................. 371/25
4,754,215  6/1988  Kawai .................. 324/73 R

FOREIGN PATENT DOCUMENTS 0342787  11/1989  European Pat. Off. .
3134579   6/1991  Japan .

OTHER PUBLICATIONS

Cheng et al., "A Simulation-Based Method for Generating Tests for Sequential Circuits", IEEE Transactions on Computers, Dec. 1990, pp. 1456–1463.
Wirtz, "CrossCheck: An ASIC Testability Solution", CrossCheck Technology, Inc. 1990 IEEE, pp. 444–448.
Brglez et al., "Combinational Profiles of Sequential Benchmark Circuits", Microelectronics Center of North Carolina, ISCAS '89, 1989 IEEE, pp. 1929–1934.
Tsu-Wei Ku, et al. "A Sequential Test Generator with Explicit Elimination of Easy-To-Test Faults", *Proceedings International Test Conference*, pp. 83–87 (1991).

*Primary Examiner*—Robert W. Beausoliel, Jr.
*Assistant Examiner*—Phung My Chung
*Attorney, Agent, or Firm*—Ratner & Prestia

[57] ABSTRACT

A test pattern generating apparatus for generating test patterns to test a sequential circuit having at least one memory element. The apparatus calculates, in response to a primary input applied to the sequential circuit, analog logic values for signal lines in the sequential circuit using a nonlinear function, then stores history data for the analog logic values with an inverse covariance matrix of the analog logic values. The apparatus then calculates an evaluation value according to the degree of variance between the analog logic values and the history data. A primary input setting unit is used for producing a next primary input which provides a maximum evaluation value from the evaluation value obtained from the present primary input. inputs produced by the primary input setting unit.

6 Claims, 11 Drawing Sheets

TEST PATTERN GENERATING APPARATUS

BACKGROUND OF THE INVENTION

1. Field of the Invention

The present invention relates to a test pattern generating apparatus for automatically generating the test pattern of a digital circuit, and particularly for a synchronized sequential circuit.

2. Description of the Prior Art

As the degree of integration of large scale Integrated (LSI) devices has increased, there has been a direct and sharp drop in the observability of internal LSI device operation. The automatic test pattern generation of used to detect faulty device has therefore become an extremely important and difficult problem. As a result, semiconductor devices constructed so that the logical values of all circuit elements are observable have become a key component of current faulty LSI device detecting technologies. A typical example of this technology is the cross check technology described by C. Writz, et al., in the paper "Cross Check: An ASIC Testability Solution" presented in the spring 1990 issue of the COMPCON technical digest (pp. 444–448).

Semiconductor testing under these observable conditions applies a test pattern capable of setting the logical value of each signal line in the circuit to 1 (ON) and 0 (OFF) while measuring the logical value of each line. Specifically, if a logical value that differs from the logical value returned by fault-free circuit is detected, the tested device As determined to have a fault. The key to this technology, therefore, is the ability to develop a test pattern generating apparatus that can obtain a test pattern capable of setting each signal line to 1 and 0 with a high detection rate and at high speed.

The literature contains many different proposals for the test pattern generating methods used in these conventional test pattern generating apparatuses. One typical example is the path sensitization method known as PODEM. This method assumes (sets) a fault on an internal signal line. To detect the fault, the logical values on the path up to the faulty signal line are set in reverse order to the input side while searching for the suitable input test pattern. However, a contradiction-free input test pattern will not necessarily always be found when searching by setting the logical values in reverse order, and it becomes necessary to perform another search by setting a different logical value. This is known as "backtracking," and because backtracking is required, the calculations performed and the amount of memory required for the path sensitization method both increase.

One test pattern generating apparatus with no backtracking is described in Japanese patent laid-open number H3-134579. The application of a test pattern generating method in a conventional test pattern generating apparatus is described briefly below with reference to FIGS. 10, 11, and 12.

FIG. 10 is a flow chart of the operation of the input search method of the conventional test pattern generating apparatus, and FIGS. 11 and 12 are graphs showing the result of the analog conversion function of the AND and OR devices, respectively. The conventional test pattern generating apparatus approximates the digital logic with the analog functions shown in FIGS. 11 and 12, and defines the cost of differences in the analog logic values of a fault-free and a faulty circuit. The test pattern generating process first assumes one fault, and then searches for the input optimizing the cost according to the flow chart in FIG. 10. The input search method selects one test vector, calculates the cost of the vector for which the Hamming distance (or signal distance) adjoins the test vector, and assigns the optimized cost vector as the next test vector. This search loop is repeated until the input that can detect the fault is determined. Thus, this conventional test pattern generating apparatus performs this process for all faults to generate the test pattern for a given semiconductor circuit.

However, specifically because this conventional test pattern generating apparatus assumes one fault and generates a corresponding test pattern, and repeats this process for all faults, the computation time required to generate all test pattern for all faults increases, and the resulting test pattern becomes longer.

SUMMARY OF THE INVENTION

Therefore, the object of the present invention to provide a test pattern generating apparatus that reduces the computations required to search for the input pattern. In addition, the determinative means of achieving this object can also shorten the generated test pattern, and eliminates the memory capacity required for backtracking because backtracking is also unnecessary.

To achieve this object, a test pattern generating apparatus for generating test patterns for testing a sequential circuit having at least one memory element, comprises: an analog logic value calculation means for calculating, in response to a primary input applied to the sequential circuit, an analog logic values of the signal lines in the sequential circuit by a nonlinear function; a data quantity calculation means for storing a history data of the analog logic values of the signal lines with an inverse covariance matrix of the analog logic values; an evaluation value calculation means for calculating an evaluation value according to a degree of variance between the analog logic values and the history data; an primary input setting means for producing a next primary input which can provide a maximum evaluation value from the evaluation value obtained from the present primary input; and a memory means for sequentially storing the primary inputs produced by the primary input setting means.

According to a preferred embodiment, the test pattern generating apparatus further comprises: a differential calculation means for calculating a differential value of every signal lines in the sequential circuit; and a evaluation value differential coefficient calculation means for calculating a differential coefficient indicative of degree of change of the evaluation value in response to each application of primary input. The primary input setting means produces a number of entries of primary inputs based on the differential coefficients and selects one entry which produces a maximum evaluation value from the evaluation value obtained in a previous cycle.

According to a preferred embodiment, the primary input setting means produces a number of primary inputs which differ from the previous primary input by a Hamming distance of 1, and selects one primary input which produces a maximum evaluation value from the evaluation value obtained in a previous cycle.

According to a preferred embodiment, the analog logic value calculation means uses a monotone increasing function as the nonlinear function for obtaining analog logic values of the logic elements.

According to a preferred embodiment, each of the data quantity calculation means and evaluation value calculation means receives the analog logic values from all the signal lines in the sequential circuit.

According to a preferred embodiment, each of the data quantity calculation means and evaluation value calculation means receives the analog logic values from input signal lines of the memory element as pseudo-primary outputs and from primary output lines of the sequential circuit as primary outputs.

By thus defining the analog logic value and using a logic value difference that cannot be obtained with digital logic values, storing the history of the evaluated signal line in the data quantity calculation means in the form of an inverse covariance matrix of the logical values, and calculating by means of the evaluation value calculation means an evaluation value which is optimized if the logical value of the evaluated signal line differs from the historical information on the evaluated signal line obtained from the data quantity calculation means, the primary input setting means searches, using the optimization direction information of the evaluation value, for the primary input value optimizing the evaluation value.

Because the evaluated signal lines for all faults can be batch set to various logical values, searching the input test pattern must only be performed once, the calculation time required for input test pattern generation can be reduced, and the generated test patterns can be shortened. Furthermore, backtracking is not required because simulation-based searching using the evaluation values is performed, and the memory capacity required for backtracking is therefore also eliminated.

BRIEF DESCRIPTION OF THE DRAWINGS

The present invention will become more fully understood from the detailed description given below and the accompanying diagrams wherein.

DESCRIPTION OF THE PREFERRED EMBODIMENTS

The preferred embodiments of a test pattern generating apparatus according to the present invention are described below with reference to the accompanying figures, of which FIG. i is a block diagram of the first embodiment.

Figure 1:
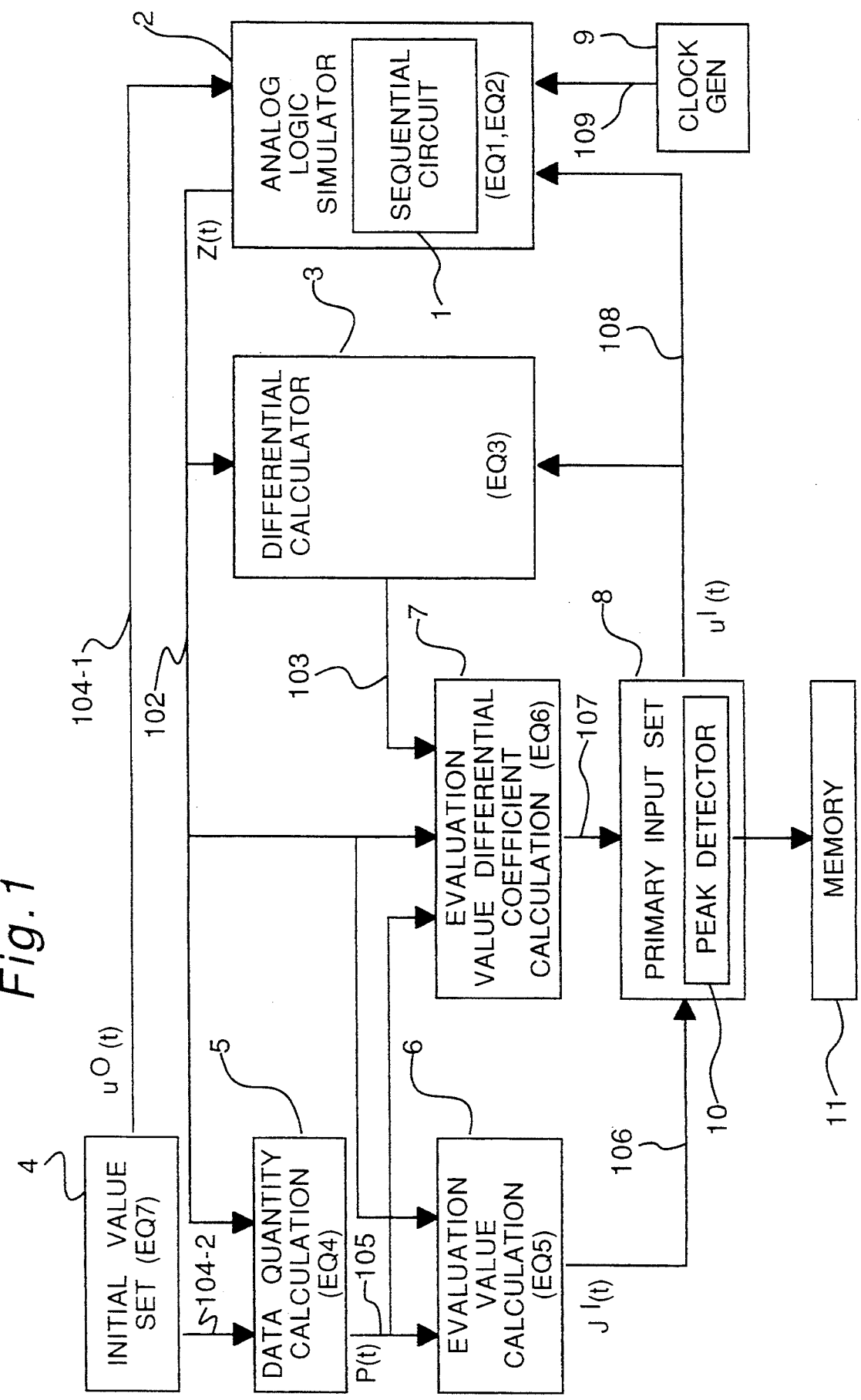
FIG. 1 is a block diagram of a test pattern generating apparatus according to the first embodiment of the invention.

Referring to FIG. 1, this first embodiment comprises a synchronized sequential circuit 1 and an analog logic simulator 2. The sequential circuit 1 comprises i flip-flops serving as memory elements, k logical elements such as AND operators, a clock input, j primary inputs, and p primary outputs. The analog logic simulator 2 converts the sequential circuit 1 to a nonlinear system, and performs the calculation shown in equation (2). It is to be noted that the logical values for all signal lines in the sequential circuit 1 can be obtained in the calculation of equation (2).

The first step is to apply equation (1) to approximate the digital logic element with analog logic. The analog logic value thus defined is a value between $-1$ and $1$; a negative symbol indicates a logic value of 0, and a positive symbol indicates a logic value of 1. A sigmoidal function expanded to the range $(-1, 1)$ is used as the analog conversion function because the differential form is thereby simplified.

n input AND element $$out(x_1, x_2, \ldots x_n) = sigmoid(x_1+x_2+ \ldots x_n-(n-1))$$

n input OR element $$out(x_1, x_2, \ldots x_n) = sigmoid(x_1+x_2+ \ldots x_n+(n-1))$$

NOT element $$out(x_1) = -x_1$$

nonlinear monotone increasing function (sigmoid)

$$sigmoid(x) = \frac{1 - e^{-a+x}}{1 + e^{-a+x}} \quad (1)$$

By merging the basic operations shown in equation (1), the sequential circuit 1 can be formulated as a nonlinear system. If the primary input of the sequential circuit 1 is $u(t) \in R^j$, the pseudo-primary input is $x(t) \in R^i$, and the primary output is $y(t) \in R^p$, the pseudo-primary output will correspond to the pseudo-primary input at the next time, and the formulated nonlinear system can be defined by equation (2).

$$x(t+1) = g(u(t), x(t))$$
$$y(t) = h(u(t), x(t)) \quad (2)$$

The differential calculator 3 computes the Jacobian matrix for the primary input value $u(t) \in R^j$ of the logical value $z(t) \in R^q$ of the fault-assumed signal line by applying equation (3). It is to be noted that the value of $z(t)$ in the following description is normalized to one (1).

$$\frac{\partial z(t)}{\partial u(t)} = \left[ \frac{\partial z_m(t)}{\partial u_n(t)} \right] \quad (3)$$

where $1 \leq m \leq q$, $1 \leq n \leq j$.

The initial value setting unit 4 sets the initial value $x(0) \in R^i$ for the flip-flop at time 0, the initial primary input $u(0) \in R^j$ and the initial data quantity value $P(-1)$. The data quantity calculation unit 5 calculates the data quantity $P(t)$ defined by the inverse covariance matrix of the logical values of the signal line by applying equation (4).

$$P(t) = P(t-1) - \frac{P(t-1)z(t)z^t(t)}{1 + z^t(t)P(t-1)z(t)} P(t-1) \quad (4)$$

The evaluation value calculation unit 6 then calculates the evaluation value $J(t)$ as defined by equation (5) from the data quantity $P(t-1)$ and the analog logical value $z(t) \in R^q$ of the fault-assumed signal lane. In this embodiment of the invention, "all fault-assumed signal lines" is the same as all signal lines.

$$J(t) = z^t(t)P(t-1)z(t) \quad (5)$$

The evaluation value differential coefficient calculation unit 7 calculates the differential coefficient $\partial J(t)/\partial u(t)$ for the primary input $u(t) \in R^j$ of the evaluation value $J(t)$ by applying equation (6).

$$\frac{\partial J(t)}{\partial u(t)} = 2z(t)^t P(t-1) \frac{\partial z(t)}{\partial u(t)} \quad (6)$$

The primary input setting unit 8 sets the primary input value for the sequential circuit 1 and the differential calculator 3, and the clock generator 9 generates a clock signal to advance the analog logic simulator 2 one time period. The primary input setting unit 8 has a peak detector 10 for detecting a peak value of the evaluation value $J^l(t)$ obtained during the subroutine #205, which will be described in detail later, and a memory 11 for storing the primary input $u(t)$ which provides the peak evaluation value $J^l(t)$ obtained during one main cycle operation of the flow chart shown in FIG. 2. After a number of main cycle operations, primary inputs $u(t)$ are stored in memory 11, and the stored primary inputs $u(t)$ are used as a series of test patterns.

The signal lines connecting the various components of the test pattern generating apparatus are indicated by reference numbers 102-109. The significance of the data carried over the signal lines will be discussed below in the operation of the test pattern generating apparatus.

Figure 2:
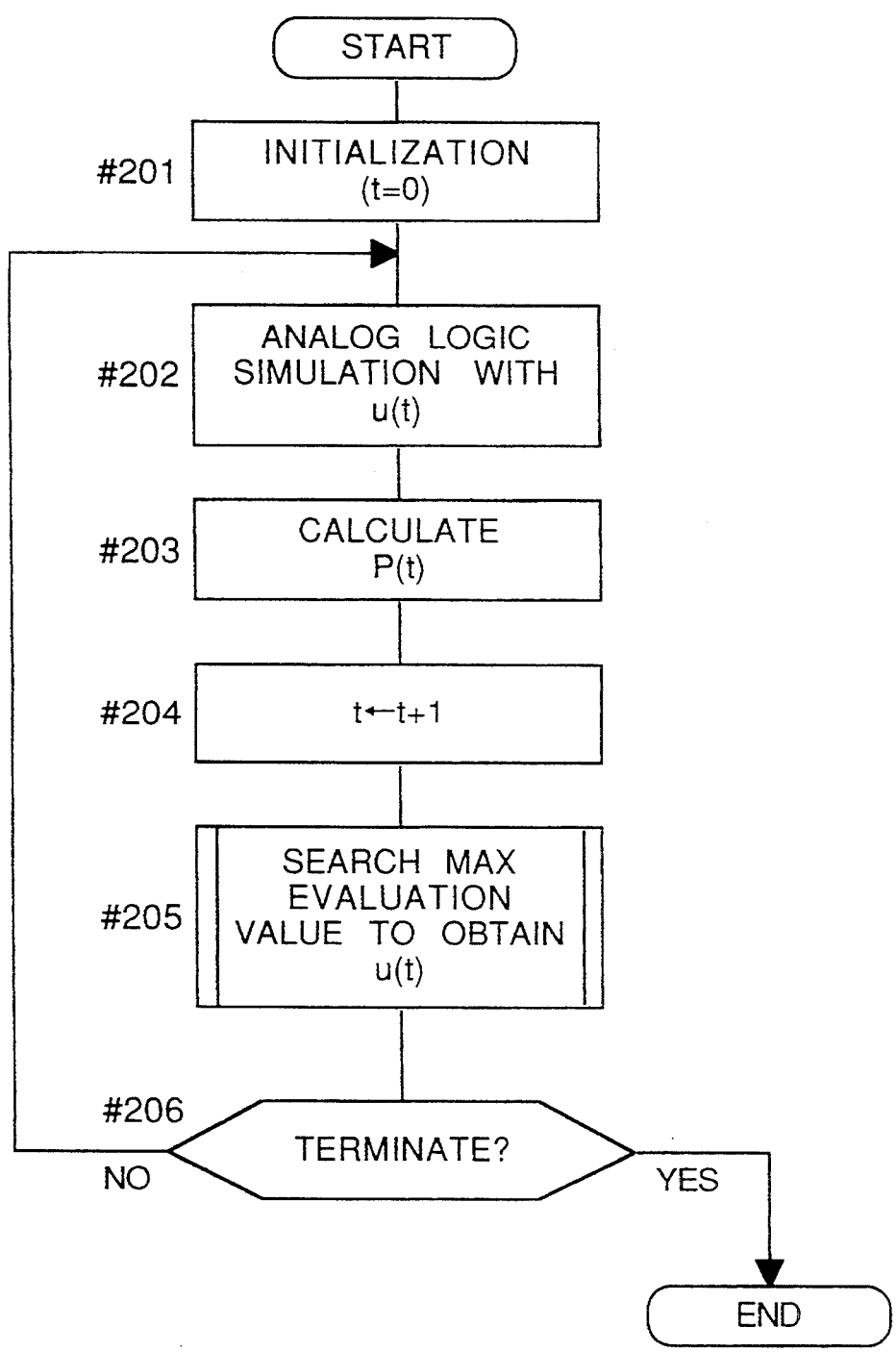
FIG. 2 is a flow chart of the operation of the first, second, third, and fourth embodiments.
Figure 3:
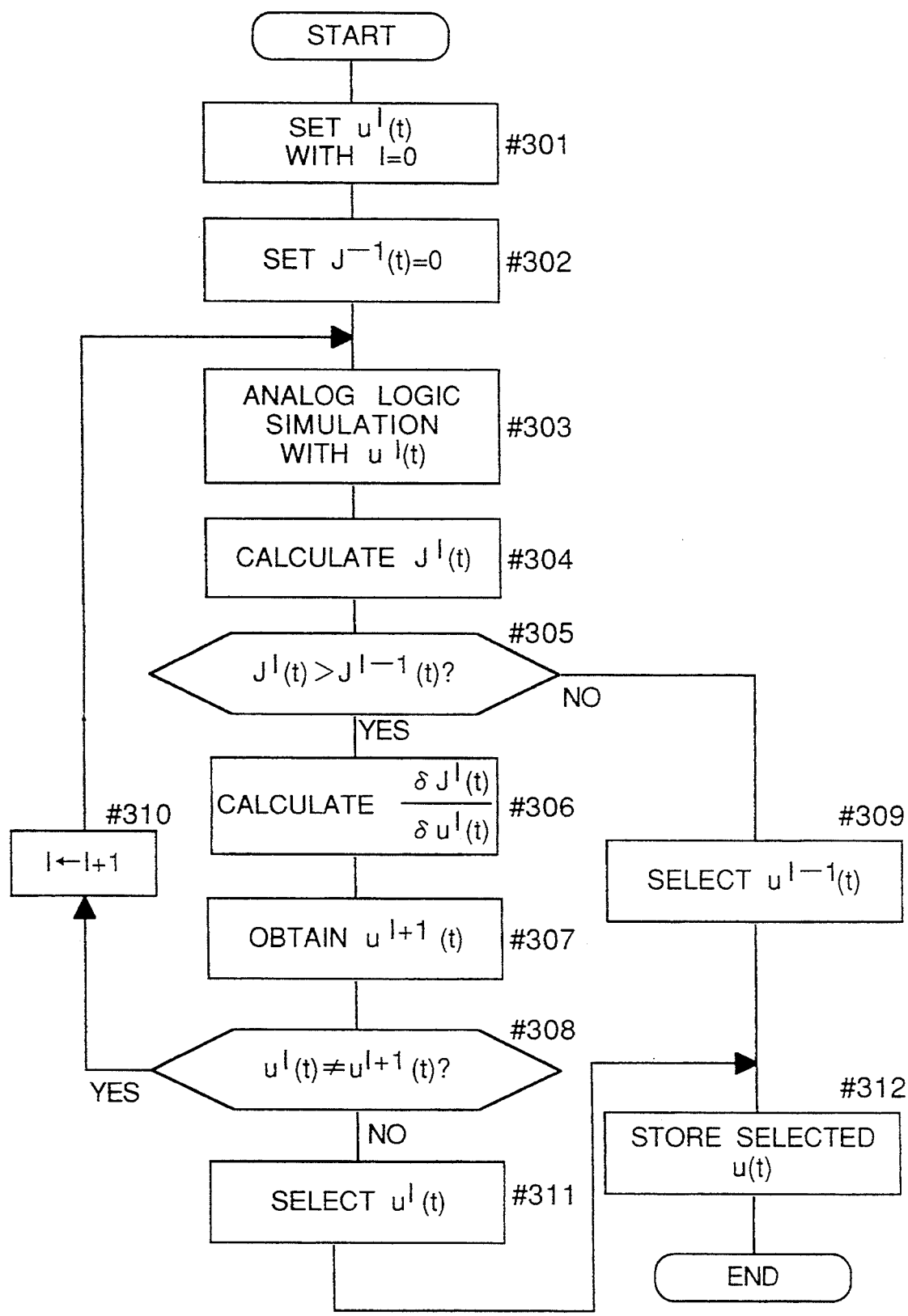
FIG. 3 is a flow chart of the input search process operation in FIG. 2.

FIG. 2 is a flow chart of the operation of a test pattern generating apparatus according to a first embodiment of the invention. FIG. 3 is a flow chart of the input search process shown as step #205 in the FIG. 2 flow chart.

The basic concept underlying the operation of the invention is described first before proceeding with a detailed description of the operation of the test pattern generating apparatus according to the first embodiment shown in FIG. 1.

The problem of generating a test pattern under conditions in which the logical values of all signal lines are observable is basically the problem of obtaining and formulating the input test pattern so that as many logical values as possible are input to all fault-assumed signal lanes. Therefore, an evaluation function that is maximized when all fault-assumed signal lines become various logical values is introduced, and the problem of generating the test pattern is restated as the problem of maximizing this evaluation function. The evaluation function is defined in equation (5), and the history of logical values for the fault-assumed signal line at each time are stored in the form of an inverse covariance matrix of the logical values as shown in equation (4). This evaluation function is maximized when a logical value that differs from the stored historical logical values of the fault-assumed signal line is obtained. Thus, by maximizing this evaluation value, all fault-assumed signal lines can be tested together. It is therefore sufficient to search the input test pattern only once, reducing the calculation time required to generate the input test pattern, and shortening the length of the generated series.

The primary input maximizing this evaluation function is then searched for at each time increment, and a nonlinear search method is used for the search. The sequential circuit is first formulated as a nonlinear system as defined by equations (1) and (2) above. Next, the primary inputs maximizing the evaluation value at each time period are searched using the differential coefficient information of the primary input values of the evaluation values. The number of search attempts can be reduced because this differential coefficient information indicates the search direction of the primary input maximizing the evaluation values. In addition, backtracking is unnecessary because the search for primary inputs maximizing the evaluation value is processed in the simulation-based way.

The detailed operation of a test pattern generating apparatus according to a first embodiment of the invention is described below with reference to FIGS. 1, 2, and 3. The overall operation is described first referring to FIGS. 1 and 2.

Step #201

This is the initialization process.

The initial value setting unit 4 clears the analog logical values of the memory elements in the sequential circuit 1 as defined by equation (7).

$$x_m(0) = 0.0 \quad (7)$$

where $1 \leq m \leq i$.

The primary input setting unit 8 sets all bits of the primary input $u(0) \in R^j$ to $-1.0$, indicating a logical value of 0, and outputs the results to signal line 108. The data quantity calculation unit 5 initializes the data quantity $P(-1)$ to a unit matrix, and outputs the result to signal line 105. It is to be noted that the method of setting the primary input $u(0) \in R^j$ shall not be limited to that described above, and the initialization of the data quantity $P(-1)$ may take a simple multiple of the unit matrix.

Step #202

The analog logic simulator 2 performs an analog logic simulation of the operation of the sequential circuit 1 using the primary input $u(0) \in R^j$ output to the signal line 108, and outputs the logical values $z(t) \in R^q$ of all fault-assumed signal lines to signal line 102.

Step #203 is part of a processing loop, and the following description therefore refers to the time of a process as simply t (where t=0 in the first pass).

Step #203

The data quantity calculation unit 5 calculates equation (4) using the logical values $z(t) \in R^q$ for all fault-assumed signal lines output to signal line 102, and obtains the data quantity P(t) at time t. This data quantity P(t) is then output to signal line 105. It is to be noted that this process is equivalent to storing the history of all fault-assumed signal line logical values at time t in the data quantity.

Step #204

The time of the sequential circuit 1 is updated to $t \leftarrow t+1$ by the command output from the clock generator 9 to the signal line 109.

Step #205

This is the step where the actual search for the primary input value maximizing the evaluation value (equation 5) at time t is performed. While the details of this process are described below with reference to FIG. 3, it is important to note here that when Step #205 is completed the optimized primary input $u(t) \in R^j$ determined by the search is output to signal line 108, and the calculated logical value $z(t) \in R^q$ of all fault-assumed signal lines for the primary input value is output to signal line 102.

Step #206

It is then determined whether the terminating condition for test pattern generation is satisfied, specifically whether the number of internal signal lines not set to both logic 0 and 1 is zero, or whether the preset search end time has been reached. If these conditions are met, the test pattern generation is terminated; if not, the procedure loops back to Step #202.

The specific procedure executed in the input search process (Step #205) is described below with reference to FIGS. 1 and 3. This procedure searches for the primary input maximizing the evaluation value (equation 5) at time t. The search is based on the differential coefficient to the primary input value of the evaluation value.

Step #301

The primary input setting unit 8 defines the initial primary input $u^0(t) \in R^j$ as the final primary input $u(t-1) \in R^j$ determined one period earlier, and outputs the value to the signal line 108.

Step #302

The evaluation value calculation unit 6 initializes the initial evaluation value $J^{-1}$ to 0.

Step #303 is part of a processing loop, and the following description therefore refers to the number of operations as simply I (where I=0 in the first pass).

Step #303

The analog logic simulator 2 performs an analog logic simulation of the operation of the sequential circuit 1 using the first primary input $u^I(t) \in R^j$ output to the signal line 108, and outputs the logical values $z(t) \in R^q$ of all fault-assumed signal lines to signal line 102.

Step #304

The evaluation value calculation unit 6 calculates the initial evaluation value $J^I(t)$ by applying equation (5) to the logical values $z(t) \in R^q$ of all fault-assumed signal lines output to signal line 102, and the data quantity P(t−1) during the previous period output to signal line 105.

Step #305

The evaluation value calculation unit 6 now compares the evaluation value $J^I(t)$ calculated in Step #304 with the evaluation value $J^{I-1}(t)$ calculated during the previous loop. If the condition new value $J^I(t)$>previous value $J^{I-1}(t)$ is TRUE, the procedure advances to Step #306, otherwise the procedure branches to Step #309.

Step #306

The differential calculator 3 calculates the Jacobian matrix for the primary input values of the fault-assumed signal line by applying equation (3) using all signal line values output to signal line 102. The result of this operation is output to signal line 103, The evaluation value differential coefficient calculation unit 7 then calculates the evaluation value differential coefficient $\partial J^I(t)/\partial u^I(t)$ by applying equation (6) using the data on signal line 103 and the data quantity P(t−1) output to signal line 105, and the analog logic values $z(t) \in R^q$ of the fault-assumed signal lines output to the signal line 102. The result is output to signal line 107. The evaluation value differential coefficient calculated here indicates the search direction of the input maximizing the evaluation function,

Step #307

The primary input setting unit 8 obtains the next primary input $u^{I+1}(t)$ according to the following rule using the evaluation value differential coefficient $\partial J^I(t)/\partial u^I(t) \in R^j$ output to signal line 107. Specifically, the sign of each bit in the evaluation value differential coefficient and the primary input is compared, and if there are any differences, the corresponding bit is inverted in the primary input to generate the next primary input value $u^{I+1}(t)$. This new value is then output to the signal line 108.

As a result, the number of search attempts for the primary input can be reduced because the primary input is searched according to the search direction of the input maximizing the evaluation value.

Step #308

The next step is for the primary input setting unit 8 to compare the primary input $u^I(t)$ with the next primary input $u^{I+1}(t)$ obtained in Step #307 to determine if there is any difference in the two strings. If there is, the counter is incremented (Step #310) $I \leftarrow I+1$, and the procedure loops back to Step #303.

Step #309

If the value test (new $J^I(t)$>previous $J^{I-1}(t)$) in Step #305 returns FALSE and the procedure branches to Step #309, the previous primary input value $u^{I-1}(t)$ is outputted to the signal line 108 from the primary input setting unit 8, and at the same time, is stored in memory 11 (Step #312). The analog logic simulator 2 therefore uses the previous primary input value $u^{I-1}(t) \in R^j$ output to the signal line 108 to calculate the logical values $z(t) \in R^q$ for all fault-assumed signal lines, outputs the result to the signal line 102, and terminates the input value search process.

Step 311

If the result in Step #308 is $u^I(t)=u^{I+1}(t)$, the primary input value $u^I(t)$ is outputted to the signal line 108 from the primary input setting unit 8, and at the same time, is stored in memory 11 (Step #312). The analog logic simulator 2 therefore uses the primary input value $u^I(t) \in R^j$ output to the signal line 108 to calculate the logical values $z(t) \in R^q$ for all fault-assumed signal lines, outputs the result to the signal line 102, and terminates the input value search process.

Next, the operation of the first embodiment will be explained using a 5-bit input data u(t), as shown in Table 1.

It is to be noted that in the above description, digital logic 1 and digital logic 0 are expressed by analog logic 1 and analog logic −1, respectively, but in the following description given in connection with Tables 1 and 2, digital logic 1 and digital logic 0 are expressed by analog logic 1 and analog logic 0, respectively.

At Step #201, the test pattern generating apparatus shown in FIG. 1 is initialized, so that the initial value setting unit 4 sets the initial value x(0) at time t=0, and produces the initial primary input u(0)=(0,0,0,0,0).

At Step #202, the analog logic simulator 2 performs an analog logic simulation of the operation of the sequential circuit 1 using the primary input u(0), and outputs the logical values z(t) to signal line 102.

At Step #203, the data quantity calculation unit 5 calculates the data quantity P(0). 10 At Step #204, the time t is incremented to t+1. Thus, in the first cycle operation in the main routine, the time is incremented to t=1.

At Step #205, the maximum evaluation value search procedure is carried out. Thus, the primary input u(1) which produces the maximum evaluation value $J^I(1)_{max}$ is detected, as will be explained later.

At Step #208, it is determined whether the terminating condition for test pattern generation is satisfied. More specifically, the terminating condition is determined as satisfied when either one of the following two conditions is met, (i) when all the internal signal lines in the sequential circuit 1 are set both logic 0 and 1, and (ii) when a predetermined search period of time has elapsed. If either one of the two conditions is met, the program ends. If not, the program returns to step #202.

The subroutine #205 for searching the maximum evaluation value $J^I(1)_{max}$ to obtain u(1) is now explained.

At Step #301, I is reset to zero, so that the primary input $u^I(t)$ is set to an initial primary input $u^0(t)$. At this time since the time is incremented to t−1 at step #204 (FIG. 2), the initial primary input value is set to $u^0(1)=(0,0,0,0,0)$.

At Step #302, the evaluation value calculation unit 6 sets the initial evaluation value $J^{-1}(1)$ to 0.

At Step #303, the analog logic simulator 2 performs an analog logic simulation of the operation of the sequential circuit 1 using the first primary input $u^I(0)$, which is now $u^0(1)=(0,0,0,0,0)$.

At Step #304, the evaluation value calculation unit 6 calculates the initial evaluation value $J^I(t)$. In the first cycle in the subroutine, it is assumed that the evaluation value is $J^0(1)=10.0$, as shown in Table 1 below.

The evaluation value is a value indicating the degree of signal changes from logic 1 (or 0) to logic 0 (or 1) effected in the internal signal lines in the sequential circuit 1 from the previous circuit condition.

At Step #305, evaluation value calculation unit 6 compares the evaluation value $J^I(t)$ calculated in Step #304 with the evaluation value $J^{I-1}(t)$ calculated during the previous cycle in subroutine #205. If $J^I(t)>J^{I-1}(t)$, the procedure advances to Step #306, and if not the procedure goes to Step #309. In the present example shown in Table 1, since $J^{-1}(1)<J^0(1)$, the program goes to Step #306.

At Step #306, the evaluation value differential coefficient $\partial J^I(t)/\partial u^I(t)$ is calculated. In the present cycle, $\partial J^0(1)/\partial u^0(1)=(-,+,+,-,-)$ is obtained, as shown in Table 1.

At Step #307, based on the obtained evaluation value differential coefficient $\partial J^I(t)/\partial u^I(t)$, the next primary input $u^{I+1}(t)$ is obtained in such a manner that the minus sign (−) is replaced with logic 0, and the plus sign (+) is replaced with the logic 1. Since the obtained evaluation value differential coefficient is $\Delta J^0(1)/\partial u^0(1)=(-,+,+,-,-)$, the next primary input is $u^1(1)=(0,1,1,0,0)$.

At step #308, the primary input $u^I(t)$ is compared with the next primary input $u^{I+1}(t)$ obtained in Step #307. If they are not the same, the program goes to Step #310 to increment the subroutine cycle number I to I+1, and returns to Step #303. If they are the same, the program goes to Step #311.

At Step #309, since it is so detected that $J^I(t)<J^{I-1}(t)$ at Step #306, it is understood that $J^{I-1}(t)$ obtained in the previous subroutine cycle had the peak or the maximum value, Thus, the $u^{I-1}(t)$ which provided the maximum evaluation value, $J^{I-1}(t)$, is selected as the representative primary input u(t).

At Step #311, since $u^I(t)=u^{I+1}(t)$ is obtained in Step #308, it is understood at this step that $J^I(t)=J^{I+1}(t)$. Thus, both $J^I(t)$ and $J^{I+1}(t)$ have the peak or the maximum value. Thus, $u^I(t)$ which provides the maximum evaluation value is selected as the representative primary input u(t).

At Step #312, the selected representative primary input u(t) is stored in the memory 11.

In this manner, according to the example shown in Table 1, in the first cycle of the main routine (FIG. 2), the primary input value $u^3(1)=(0,1,0,1,1)$ is selected as the first representative u(1)=(0,1,0,1,1) and is stored in the memory 11. The initial representative primary input u(0)=(0,0,0,0,0) is previously stored in memory 11. To obtain the first representative in the first main routine, five subroutine cycles (FIG. 3) are carried out.

Then, in the second cycle of the main routine, the analog logic simulation starts (Step #202) by using the first representative obtained in the previous cycle, which is u(1)=(0,1,0,1,1). In the second cycle of the main routine, the primary input value $u^5(2)=(1,1,0,0,1)$ is selected as the second representative u(2)=(1,1,0,0,1) and is stored in the memory 11. To obtain the second representative in the second main routine, seven subroutine cycles (FIG. 3) are carried out.

TABLE 1

| Cycle No. | Primary input value | Evaluation value | Evaluation value differential coefficient |
|---|---|---|---|
| M1-S1* | | $J^{-1}(1) = 0$ | |
| M1-S1 | $u^0(1) = (0,0,0,0,0)$ | $J^0(1) = 10.0$ | −,+,+,−,− |
| M1-S2 | $u^1(1) = (0,1,1,0,0)$ | $J^1(1) = 12.0$ | +,+,+,−,+ |
| M1-S3 | $u^2(1) = (1,1,1,0,1)$ | $J^2(1) = 12.8$ | −,+,−,+,+ |
| M1-S4 | $u^3(1) = (0,1,0,1,1)$ | $J^3(1) = 13.2$ | −,−,+,−,+ |
| M1-S5 | $u^4(1) = (0,0,1,0,1)$ | $J^4(1) = 13.0$ | |

TABLE 1-continued

| Cycle No. | Primary input value | Evaluation value | Evaluation value differential coefficient |
|---|---|---|---|
| M2-S1 | $u^0(2) = (0,1,0,1,1)$ | $J^0(2) = 8.5$ | −,−,+,−,+ |
| M2-S2 | $u^1(2) = (0,0,1,0,1)$ | $J^1(2) = 9.0$ | −,+,+,−,+ |
| M2-S3 | $u^2(2) = (0,1,1,0,1)$ | $J^2(2) = 9.2$ | −,−,+,+,+ |
| M2-S4 | $u^3(2) = (0,0,1,1,1)$ | $J^3(2) = 9.5$ | −,+,+,−,− |
| M2-S5 | $u^4(2) = (0,1,1,0,0)$ | $J^4(2) = 10.2$ | +,+,−,−,+ |
| M2-S6 | $u^5(2) = (1,1,0,0,1)$ | $J^5(2) = 10.7$ | −,+,−,−,+ |
| M2-S7 | $u^6(2) = (0,1,0,0,1)$ | $J^6(2) = 10.7$ | −,+,−,−,+ |

NOTE*:
"M" represents the main routine shown in FIG. 2, and
"S" represents the subroutine shown in FIG 3.

In this manner, after each cycle of the main routine, one representative primary input value u(t) is stored in memory 11. When N main routine cycles are carried out, memory 11 stores N+1 primary input values u(0), u(1), u(2), . . . , u(N) in the obtained order. To test a sequential circuit, the N+1 primary input values are applied sequentially to the inputs of the sequential circuit and the circuit operation is checked by observing all the signal lines in the circuit. If the output values are the same as the expected values, the sequential circuit has no fault, but if not, it is determined that the sequential circuit has some faults.

Figure 4:
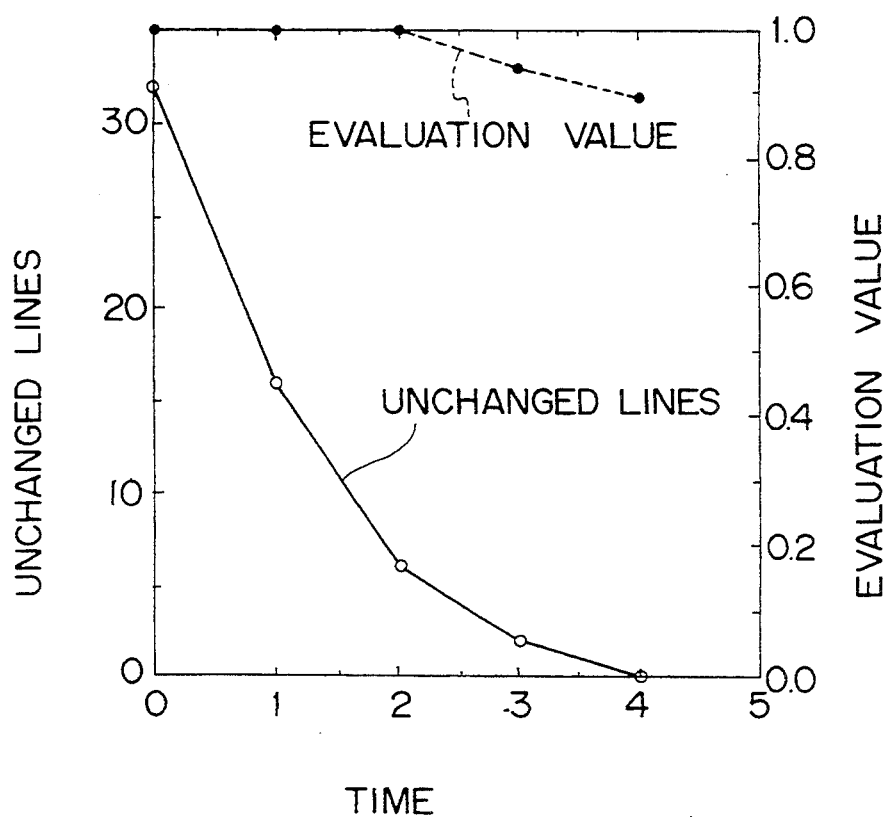
FIG. 4 is a graph of the evaluation values in the test pattern generation process of the test pattern generating apparatus according to the first embodiment of the invention, and the number of unchanged signal lines.

FIG. 4 is a graph of the results using the benchmark circuit S27 described on pages 1929-1934 of the proceedings of an international symposium on circuits and systems (May 1989) under The Institute of Electrical and Electronics Engineers, Inc. as the sequential circuit 1. In FIG. 4, the search time is on the X-axis, and the number of signal lines that has not been set both logic 0 and 1 is shown on the Y-axis. As shown in the figure, all signal lines can be set both logic 0 and 1 by search time 4. In other words, it is possible to generate the test pattern enabling fault detection of all signal lines, which are the fault-assumed signal lines, with a test pattern length of 4.

As described hereinabove, the input test pattern search can be completed in a single operation, the time required to generate the input test pattern is shortened, and the length of the generated test pattern is shorter because the evaluation value shown in equation (5) for all fault-assumed signal lines being evaluated is optimized, and all fault-assumed signal lines can be batch set to various suitable logical values. In addition, test pattern generating apparatus of the first embodiment can also reduce the number of operations required to search the primary input because information showing the optimization direction of the evaluation value is calculated using a differential coefficient for the primary input value of the evaluation value. Finally, backtracking is also not required because the search is performed in the simulation based way.

It is to be noted that the primary input setting unit 8 in Step #301 of the present embodiment defines the final primary input $u(t-1) \in R^j$ determined during the previous loop (t=t−1) as the initial primary input $u^0(t) \in R^j$ of the current search, but the following method can also be applied. Specifically, half of the bats in the final primary input $u(t-1) \in R^j$ determined during the previous loop (t=t−1) can be inverted (if j is an odd number, then invert (j+1)/2 bits), and the resulting string defined as the initial primary input $u^0(t)$. In this case, the bits to be inverted are selected starting from those for which the absolute value of the differential coefficient $\partial J(t-1)/\partial u(t-1) \in R^j$ of the evaluation value in the previous loop (t=t−1) is smallest.

SECOND EMBODIMENT

The second embodiment of a test pattern generating apparatus according to the present invention is described below with reference to the accompanying figures.

This second embodiment differs from the first embodiment described above in that the method of obtaining the information for the optimization direction of the evaluation value is different, and as a result the method used by the primary input setting unit 8 to search for the primary input $u(t) \in R^j$ maximizing the evaluation value also differs. In this embodiment, the evaluation value of the primary input having a Hamming distance of one from the initial primary input is calculated, and the evaluation value optimization direction information is obtained from the primary input with the greatest evaluation value. Because the digital logic elements are approximated using the nonlinear function shown in equation (1), small differences in the evaluation value which cannot be obtained with digital logic can be detected to determine the optimization direction of the evaluation value.

Figure 5:
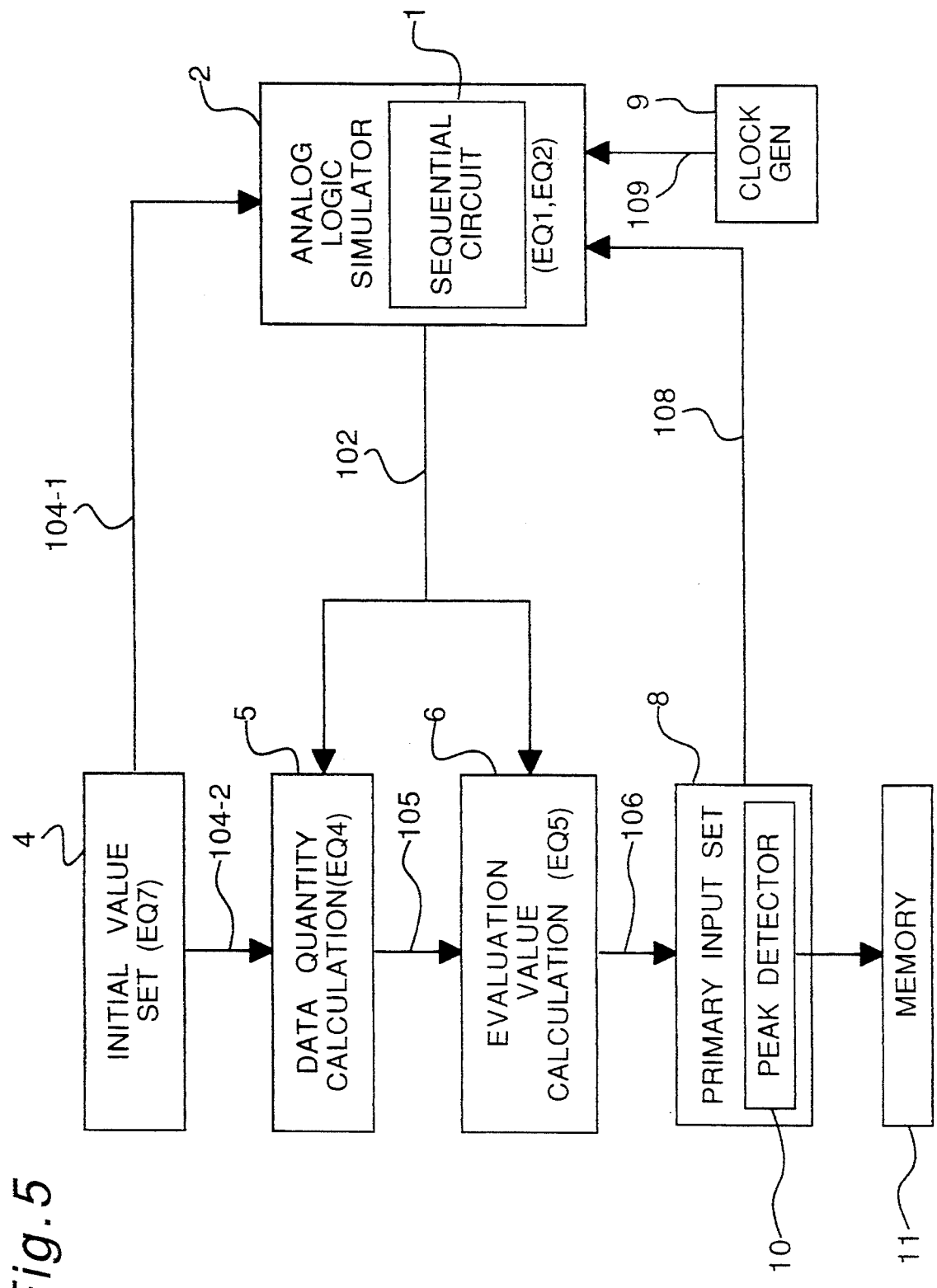
FIG. 5 is a block diagram of a test pattern generating apparatus according to the second embodiment of the invention.

FIG. 5 is a block diagram of a test pattern generating apparatus according to the second embodiment of the invention. The significant difference between this and the first embodiment shown in FIG. 1 is that the differential calculator 3 and the evaluation value differential coefficient calculation unit 7 are eliminated. A detailed description of the construction of this embodiment is therefore omitted.

The operation of the test pattern generating apparatus according to the second embodiment also follows the main routine shown in FIG. 2, but the specific operation carried out in the subroutine Step #205 is different.

Figure 6:
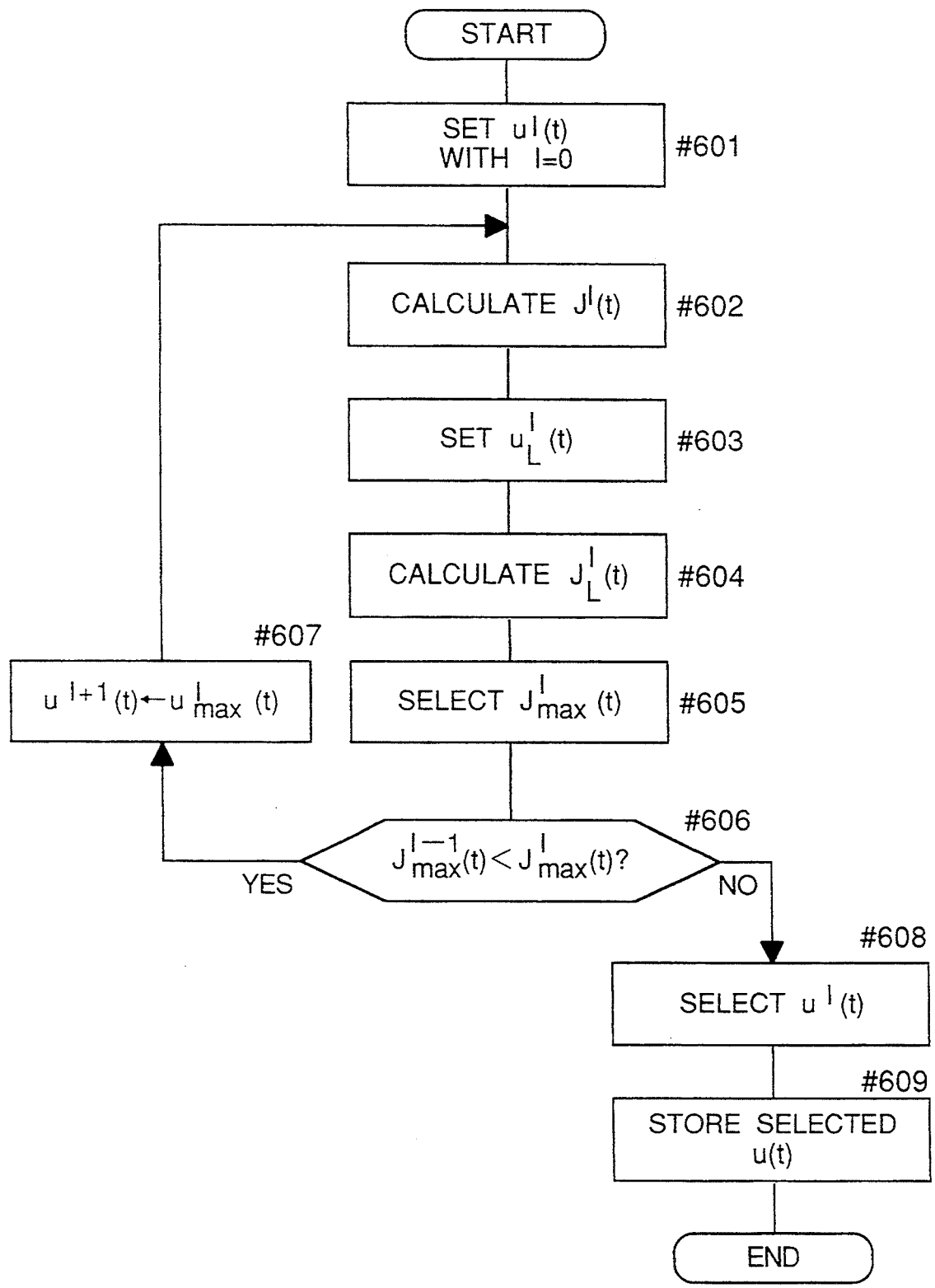
FIG. 6 is a flow chart of the input search process operation in the second, third, and fourth embodiments of the invention.

FIG. 6 shows a flow chart of a subroutine corresponding to that shown in FIG. 3.

Step #601

The primary input setting unit 8 defines the initial primary input $u^0(t) \in R^j$ as the final primary input $u(t-1) \in R^j$ determined one period (t=t−1) earlier, and outputs the value to the signal line 108.

Step #602 is part of a processing loop, and the following description therefore refers to the number of operations as simply I (where I=0 in the first pass).

Step #602

The analog logic simulator 2 performs an analog logic simulation of the operation of the sequential circuit 1 using the first primary input $u^I(0) \in R^j$ output to the signal line 108, and outputs the logical values $z(t) \in R^q$ of all fault-assumed signal lines to signal line 102.

The evaluation value calculation unit 6 calculates the initial evaluation value $J^I(t)$ by applying equation (5) to the logical values $z(t) \in R^q$ of all fault-assumed signal lines output to signal line 102, and the data quantity P(t−1) during the previous period output to signal line 105.

Step #603

The primary input setting unit 8 generates j primary input values $u^I_L(t) \in R^J$ (L=1, . . . j) having a Hamming distance of one from the initial primary input value $u^I(t) \in R^j$. More specifically, the primary input setting unit 8 generates j initial primary input values for which the L bit sign is inverted.

Step #604

The primary input setting unit 8 outputs one of the j primary input values $u^I_L(t) \in R^j$ to the signal line 108. The analog logic simulator 2 performs an analog logic simulation of the operation of the sequential circuit 1 using the primary input values $u^I_L(t) \in R^j$ output to the signal line 108, and outputs the logical values $z(t) \in R^q$ for all fault-assumed signal lines to the signal line 102.

The evaluation value calculation unit 6 calculates the evaluation value $J^I_L(t)$ by applying equation (5) to the logical values $z(t) \in R^q$ of all fault-assumed signal lines output to signal line 102, and the data quantity $P(t-1)$ during the previous period output to signal line 105.

This operation is performed for each of the different j primary input values.

Step #605

The primary input setting unit 8 compares j evaluation values $J^I_L(t)$ and selects the primary input $u^I_{max}(t) \in R^j$ corresponding to the greatest evaluation value $J^I_{max}(t)$. This maximum primary input $u^I_{max}(t) \in R^j$ indicates the optimization direction of the evaluation value from the initial primary input $u^I(t) \in R^j$.

Step #606

The primary input setting unit 8 compares the initial evaluation value $J^I(t)$ with the maximum evaluation value $J^I_{max}(t)$. If the condition initial value $J^I(t) <$ maximum value $J^I_{max}(t)$ is TRUE, the procedure advances to Step #607, otherwise the procedure branches to Step #608.

Step #607

The primary input setting unit 8 defines the maximum primary input $u^I_{max}(t) \in R^j$ as the next initial primary input $u^{I+1}(t) \in R^j$, and outputs the result to the signal line 108. The counter is then incremented ($I \leftarrow I+1$) before returning to Step #602.

Step #608

The primary input setting unit 8 outputs the initial primary input $u^I(t) \in R^j$ as the final search result $u(t) \in R^j$ to the signal line 108. The analog logic simulator 2 performs an analog logic simulation of the operation of the sequential circuit 1 using the final search result $u(t) \in R^j$ output to the signal line 108, and outputs the logical values $z(t) \in R^q$ for all fault-assumed signal lines to the signal line 102. The input value search process is then terminated.

Next, the operation of the second embodiment will be explained using a 5-bit input data $u(t)$, as shown in Table 2.

At Step #601, the input setting unit 8 sets $u^0(1) = (0,0,0,0,0)$.

At Step #602, the evaluation value calculation unit 6 calculates the initial evaluation value $J^I(t)$. In the first cycle in the subroutine, it is assumed that the evaluation value is $J^0(1) = 10.0$, as shown in Table 2 below.

At Step #603, the primary input setting unit 8 generates a plurality of primary input values $u^I_L(t)$, the number of which is equal to the number of bits in the primary input value. According to the example shown in Table 2, in the first subroutine cycle M1-S1, five primary input values $u^0_1(1) = (1,0,0,0,0)$, $u^0_2(1) = (0,1,0,0,0)$, $u^0_3(1) = (0,0,1,0,0)$, $u^0_4(1) = (0,0,0,1,0)$ and $u^0_5(1) = (0,0,0,0,1)$ are produced based on the initial primary input $u^0(1) = (0,0,0,0,0)$. Each of the five primary input values is one Hamming distance apart from the initial primary input $u^0(1)$. One Hamming distance is when a difference between two n-bit signals is in only one corresponding bit position.

At Step #604, the evaluation value calculation unit 6 calculates the evaluation values $J^0_1(1) = 11.0$, $J^0_2(1) = 10.8$, $J^0_3(1) = 12.2$, $J^0_4(1) = 14.2$ and $J^0_5(1) = 13.5$ for five primary input values $u^0_1(1) = (1,0,0,0,0)$, $u^0_2(1) = (0,1,0,0,0)$, $u^0_3(1) = (0,0,1,0,0)$, $u^0_4(1) = (0,0,0,1,0)$ and $u^0_5(1) = (0,0,0,0,1)$, respectively.

At Step #605, the primary input setting unit 8 selects one primary input $u^I_{max}(t)$ which has produced the largest evaluation value $J^I_{max}(t)$. To this end, first, the largest evaluation value $J^I_{max}(t)$ is selected, and then, the corresponding primary input $u^I_{max}(t)$ is selected. According to the example shown in Table 2, in the first subroutine cycle M1-S1, $u^0_4(1) = (0,0,0,1,0)$ which has produced the largest evaluation value $J^0_4(1) = 14.2$ is selected.

At step #606, the selected largest evaluation value $J^I_{max}(1)$ is compared with the same obtained in the previous subroutine cycle $J^{I-1}_{max}(1)$. Thus, in the example shown in Table 2, $J^0_4(1) = 14.2$ is compared with $J^0(1) = 10.0$. When the newly selected largest evaluation value $J^I_{max}(1)$ is greater than that $J^{I-1}_{max}(1)$ selected in the previous subroutine cycle, the program goes to Step #607 to employ the selected primary input $u^I_{max}(t)$ as the dominant primary input $u^{I+1}(t)$. If on the other hand, when $J^I_{max}(1) < J^{I-1}_{max}(1)$, the program goes to Step #608.

At Step #608, the primary input $u^I_{max}(t)$ selected at Step #605 in this subroutine is denoted as a representative primary input $u^I(t)$. In the example shown in Table 2, $u^4(1)$ is denoted as the representative primary input $u^I(t)$.

At Step #609, the representative primary input $u^I(t)$ is stored in memory 11.

TABLE 2

| | | | |
|---|---|---|---|
| M1-S1 | $u^0(1) = (0,0,0,0,0)$ | | $J^0(1) = 10.0$ |
| | | $u_1^0(1) = (1,0,0,0,0)$ | $J_1^0(1) = 11.0$ |
| | | $u_2^0(1) = (0,1,0,0,0)$ | $J_2^0(1) = 10.8$ |
| | | $u_3^0(1) = (0,0,1,0,0)$ | $J_3^0(1) = 12.2$ |
| | | $u_4^0(1) = (0,0,0,1,0)$ | $J_4^0(1) = 14.2$ |
| | | $u_5^0(1) = (0,0,0,0,1)$ | $J_5^0(1) = 13.5$ |
| M1-S2 | $u^1(1) = (0,0,0,1,0)$ | | $J^1(1) = 14.2$ |
| | | $u_1^1(1) = (1,0,0,1,0)$ | $J_1^1(1) = 13.3$ |
| | | $u_2^1(1) = (0,1,0,1,0)$ | $J_2^1(1) = 16.8$ |
| | | $u_3^1(1) = (0,0,1,1,0)$ | $J_3^1(1) = 15.1$ |
| | | $u_4^1(1) = (0,0,0,0,0)$ | $J_4^1(1) = 10.0$ |
| | | $u_5^1(1) = (0,0,0,1,1)$ | $J_5^1(1) = 14.5$ |
| M1-S3 | $u^2(1) = (0,1,0,1,0)$ | | $J^2(1) = 16.8$ |
| | | $u_1^2(1) = (1,1,0,1,0)$ | $J_1^2(1) = 18.5$ |
| | | $u_2^2(1) = (0,0,0,1,0)$ | $J_2^2(1) = 14.2$ |
| | | $u_3^2(1) = (0,1,1,1,0)$ | $J_3^2(1) = 17.8$ |
| | | $u_4^2(1) = (0,1,1,0,0)$ | $J_4^2(1) = 17.3$ |
| | | $u_5^2(1) = (0,1,0,1,1)$ | $J_5^2(1) = 15.9$ |
| M1-S4 | $u^3(1) = (1,1,0,1,0)$ | | $J^3(1) = 18.5$ |
| | | $u_1^3(1) = (0,1,0,1,0)$ | $J_1^3(1) = 16.8$ |
| | | $u_2^3(1) = (1,0,0,1,0)$ | $J_2^3(1) = 13.3$ |
| | | $u_3^3(1) = (1,1,1,1,0)$ | $J_3^3(1) = 19.7$ |
| | | $u_4^3(1) = (1,1,0,0,0)$ | $J_4^3(1) = 19.1$ |
| | | $u_5^3(1) = (1,1,0,1,1)$ | $J_5^3(1) = 12.5$ |
| M1-S5 | $u^4(1) = (1,1,1,1,0)$ | | $J^4(1) = 19.7$ |
| | | $u_1^4(1) = (0,1,1,1,0)$ | $J_1^4(1) = 17.8$ |
| | | $u_2^4(1) = (1,0,1,1,0)$ | $J_2^4(1) = 16.9$ |
| | | $u_3^4(1) = (1,1,0,1,0)$ | $J_3^4(1) = 19.5$ |
| | | $u_4^4(1) = (1,1,1,0,0)$ | $J_4^4(1) = 18.5$ |

TABLE 2-continued

| $u_5^4(1) = (1,1,1,1,1)$ | $J_5^4(1) = 17.1$ |

NOTE*:
"M" represents the main routine shown in FIG. 2, and
"S" represents the subroutine shown in FIG. 3.

Therefore, in the first main routine cycle and in the first subroutine cycle M1–S1, the primary input $u^0_4(1)$ that provides the maximum evaluation value $J^0_4(1)$ is selected as the dominant primary input $u^1(1)$ for use in the next subroutine cycle M1–S2. In the next subroutine cycle, the primary input $u^1_2(1)$ that provides the maximum evaluation value $J^1_2(1)$ is selected as the dominant primary input $u^2(1)$ fox use in the next subroutine cycle M1–S3. In this manner, in the third and fourth subroutine cycles M1–S3 and M1–S4, the dominant primary input $u^3(1)$ and $u^4(1)$ are selected. In the fifth subroutine cycle M1–S5, since there is no evaluation value which is greater than the evaluation value $J^4(1)$ of the current dominant primary input $u^4(1)$, it is understood that the current dominant primary input $u^4(1)$ is the one that can provide the maximum evaluation value $J^4(1)$. Therefore, the current dominant primary input $u^4(1)$ is selected as the representative primary input $u^4(1)$ for the first main routine M1, which started by using the initial primary input $u^0(1)$.

The second main routine starts using the just obtained representative primary input $u^4(1)$ as the initial primary input. By repeating the subroutines, a second representative primary input $u^I(2)$ is obtained and is stored in memory 11.

In this manner, after each main routine, one representative primary input $u^I(t)$ is obtained and is stored in memory 11. When N main routine cycles are carried out, memory 11 stores N+1 primary input values $u^I(0)$, $u^I(1)$, $u^I(2)$, ..., $u^I(N)$ in the obtained order. To test a sequential circuit, the N+1 primary input values are applied sequentially to the inputs of the sequential circuit and the circuit operation is checked by observing the values of all the signal lines.

As described hereinabove, the input test pattern search can be completed in a single operation, the time required to generate the input test pattern is shortened, and the length of the generated test pattern is shorter because the evaluation value shown in equation (5) for all fault-assumed signal lines being evaluated is optimized, and all fault-assumed signal lines can be batch set to various suitable logical values. In addition, the test pattern generating apparatus of the second embodiment can also reduce the number of operations required to search the primary input because information showing the optimization direction of the evaluation value is calculated from primary input evaluation values that differ from the initial primary input values by a Hamming distance of only one. Finally, backtracking is also not required because the search is performed in the simulation based way.

It is to be noted that primary input values having a Hamming distance of one from the initial input value are generated in the second embodiment, but proximal primary input values other than those with a Hamming distance of one can also be set.

THIRD EMBODIMENT

The third embodiment of a test pattern generating apparatus according to the present invention is described below with reference to FIGS. 7 and 8.

The third embodiment differs from the first and second embodiments described above in that the primary output values $y(t) \in R^p$ and pseudo-primary output values $x(t+1) \in R^i$ are used as the evaluation signal lines of the evaluation function instead of using all fault-assumed signal lanes. The primary output values are obtained at the primary output lines of the sequential circuit, and the pseudo-primary output values are obtained at the inputs of memory elements, such as flip-flops, in the sequential circuit. Why this is possible is described first.

The object of generating the test pattern is to obtain a test pattern that can be used to set all fault-assumed signal lines to both logical value 0 and logical value 1. To this end, the first and second embodiments described above use all fault-assumed signal lines as the evaluation signal lines, but this is not necessarily required because the digital logic elements are approximated by a nonlinear function as shown in equation (1), and the differences in the logical values of all fault-assumed signal lines can be observed from the primary output and the pseudo-primary output. This is described further below referring to the combinational circuit diagram shown in FIG. 7.

Figure 7:
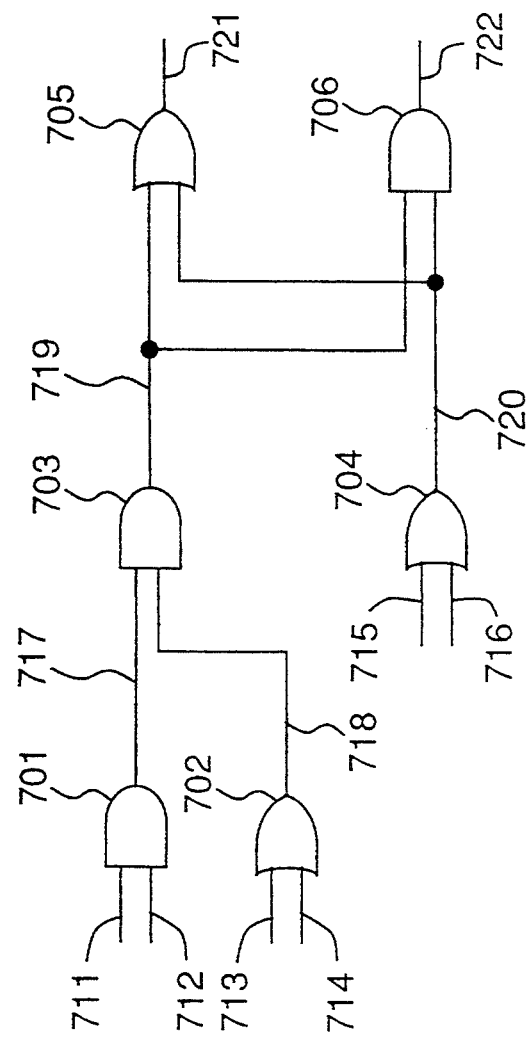
FIG. 7 is a circuit diagram of the combinational circuit.

As shown in FIG. 7, this combinational circuit comprises dual-input AND elements 701, 703, and 706, dual-input OR elements 702, 704, and 705, primary inputs 711–716 to the combinational circuit, and primary outputs 721, 722. The logical values of the digital logic elements are compared with the logical values in analog logic approximating the digital logic elements using the nonlinear function shown in equation (1). As stated above, a negative symbol indicates a logic value of 0, and a positive symbol indicates a logic value of 1 in the analog logic value expressions.

| Input 1: | (711, 712, 713, 714, 715, 726) |
| | = (−1, −1, 1, 1, 1, 1): analog logic |
| | = (0, 0, 1, 1, 1, 1): digital logic |

TABLE 3

| | Internal line | | | Primary line | |
|---|---|---|---|---|---|
| Signal line | 717 | 718 | 719 | 720 | 721 | 722 |
| Digital logic | 0 | 1 | 0 | 1 | 1 | 0 |
| Analog logic | −1.00 | 1.00 | −0.941 | 1.00 | 0.952 | −0.929 |

| Input 2: | (711, 712, 713, 714, 715, 716) |
| | = (−1, −1, −1, −1, 1, −1): analog logic |
| | = (0, 0, 0, 0, 1, 0): digital logic |

TABLE 4

| | Internal line | | | Primary line | |
|---|---|---|---|---|---|
| Signal line | 717 | 718 | 719 | 720 | 721 | 722 |
| Digital logic | 0 | 0 | 0 | 1 | 1 | 0 |
| Analog logic | −1.00 | −0.941 | −1.00 | 0.941 | 0.929 | −0.952 |

As shown in the above table, the digital logic at output lines 721 and 722 are the same for two different primary input values, but the corresponding analog logic primary output values differ. This is because differences in the primary input values result in different logical values for each signal line in analog logic, and the effect of these differences is propagated between logic elements. As an example consider the logical value of signal line 719.

For both inputs 1 and 2, the logical value of the signal line 717 is 0 in digital logic, resulting in a logical value of 0 for signal line 719 also. At this time the difference to the logical value of the signal line 718 has no effect on the logical value of signal line 719. In analog logic, however, the logical value of signal line 718 affects the logical value of signal line 719. Specifically, when the signal line 718 has a logical value indicating logic 1, the logical value of signal line 719 changes from a value indicating perfect logic 0 to a logical value of logic 0 that is close to logic 1. It is therefore possible to observe differences in the logical values of the signal lines from the output side that cannot be directly observed in analog logic. Considering the overall combinational circuit, differences in the logical values of all signal lines are observable from the primary outputs.

Thus, differences in the logical values of the fault-assumed signal lines can be observed from the primary outputs and pseudo-primary outputs, and selected signal lines can be evaluated by setting those lines as the primary output and pseudo-primary output and then using this effect. If these signal lines are set to various logical values by means of the evaluation function, the logical values of the fault-assumed signal lines can be indirectly set. As a result, the dimensions of the data quantity P(t) can generally be reduced compared with the first and second embodiments, and the calculation time of the evaluation values can be reduced.

Figure 8:
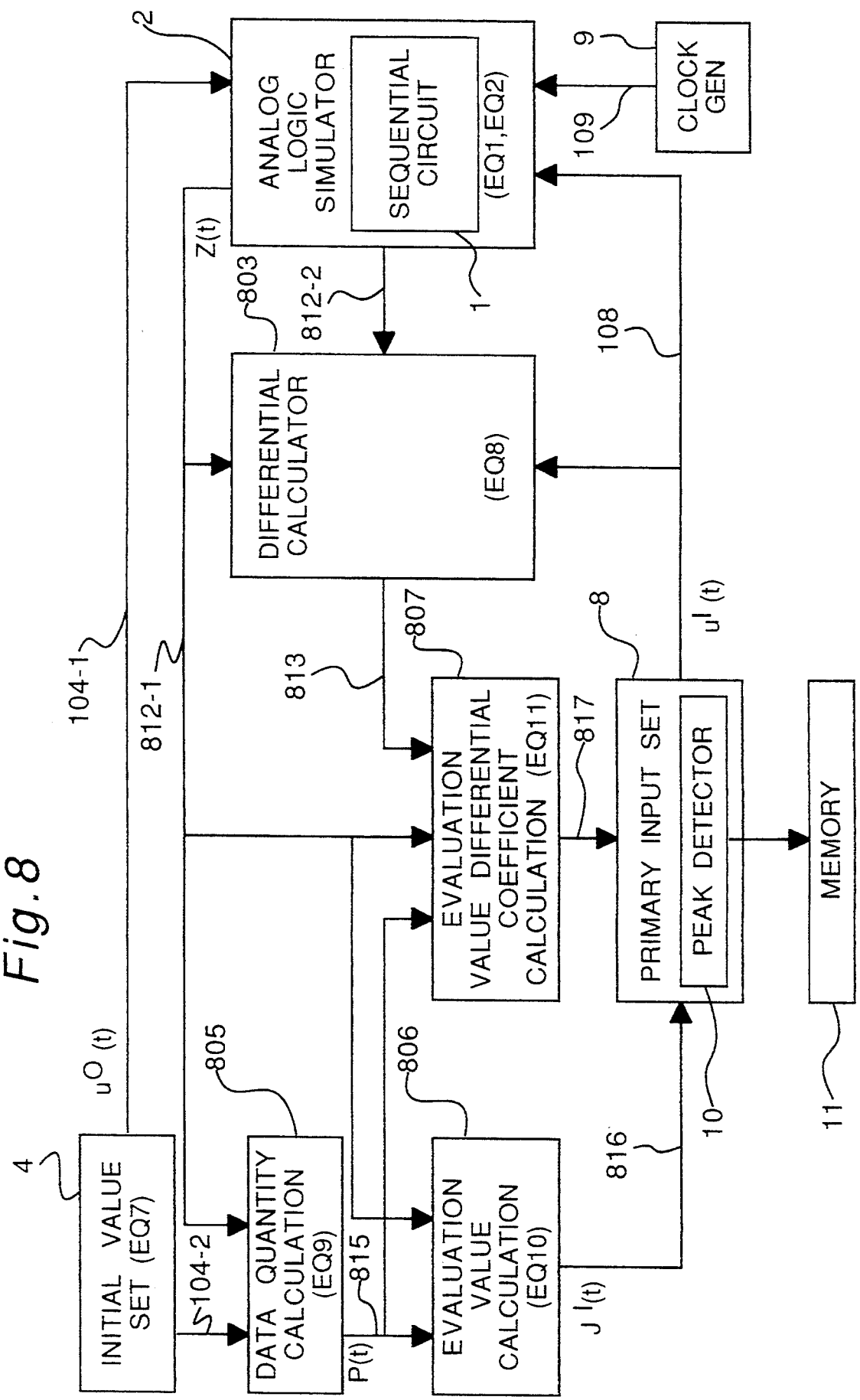
FIG. 8 is a block diagram of a test pattern generating apparatus according to the third embodiment of the invention.

FIG. 8 is a block diagram of a test pattern generating apparatus according to the third embodiment of the invention. It is to be noted that only the differences between this and the first embodiment are described below.

Referring to FIG. 8, this third embodiment comprises an analog logic simulator 2 for simulating the sequential circuit 1 in analog logic, outputting the logical values of all signal lines to signal line 812-2, and the primary output values y(t) ∈ $R^p$ and pseudo-primary output values x(t+1) ∈ $R^i$ to signal line 812-1. Thus, signal lane 812-2 is substantially the same as signal line 102 in the first embodiment. And, the signal line 812-1 carries only the outputs from the logic elements, such as 705 and 706 in FIG. 7, which are connected to the primary output lines and the outputs from memory elements such as flip-flops. Thus, the amount of data supplied to the units 805, 806 and 807 are greatly reduced, resulting in short calculation time.

The differential calculator 803 computes the Jacobian matrix for the primary input value u(t) ∈ $R^j$ of the output value o(t) ∈ $R^{i+p}$ combining the primary output values and pseudo-primary output values by applying equation (8). It is to be noted that the value of o(t) in the following description is normalized to one (1).

$$\frac{\partial o(t)}{\partial u(t)} = \left[\frac{\partial o_m(t)}{\partial u_n(t)}\right] \quad (8)$$

where i≦m≦i+p, 1≦n≦j, and o(t)=(y(t), x(t+1)).

The data quantity calculation unit 805 calculates the data quantity P(t) defined by the inverse matrix of the covariance matrix of the output values o(t) ∈ $R^{i+p}$ by applying equation (9).

$$P(t) = P(t-1) - \frac{P(t-1)o(t)o^t(t)}{1 + o^t(t)P(t-1)o(t)} P(t-1) \quad (9)$$

The evaluation value calculation unit 806 then calculates the evaluation value J(t) as defined by equation (10) from the data quantity P(t−1) and the output values o(t) ∈ $R^{i+p}$.

$$J(t) = o^t(t)P(t-1)o(t) \quad (10)$$

The evaluation value differential coefficient calculation unit 807 calculates the differential coefficient ∂J(t)/∂u(t) ∈ $R^j$ for the primary input u(t) ∈ $R^j$ of the evaluation value J(t) by applying equation (11).

$$\frac{\partial J(t)}{\partial u(t)} = 2o(t)^t P(t-1) \frac{\partial o(t)}{\partial u(t)} \quad (11)$$

The present embodiment has two operating modes for obtaining the optimization direction of the evaluation value. The first uses the differential coefficient to the primary input u(t) ∈ $R^j$ of the evaluation value J(t) as described with reference to the first embodiment above, and the second mode uses information on the evaluation values of the primary inputs that differ from the initial input $u^j(t)$ ∈ $R^j$ by a Hamming distance of one. The flow of these two operating modes is identical to the corresponding operations of the first and second embodiments, and the following description of the operation of the third embodiment therefore refers to FIGS. 8, 2, 3, and 6 starting with the flow chart in FIG. 2.

Step #201

This is the initialization process.

The initial value setting unit 4 clears the logical values of the memory elements in the sequential circuit 1 as defined by equation (7).

The primary input setting unit 8 sets all bits of the primary input u(0) ∈ $R^j$ to −1.0, including a logical value of 0, and outputs the results to signal line 108. The data quantity calculation unit 805 initializes the data quantity P(−1) to a unit matrix, and outputs the result to signal line 815. It is to be noted that the method of setting the primary input u(0) ∈ $R^j$ shall not be limited to that described above, and the initialization of the data quantity P(−1) may take a simple multiple of the unit matrix.

Step #202

The analog logic simulator 2 performs an analog logic simulation of the operation of the sequential circuit 1 using the primary input u(0) ∈ $R^j$ output to the signal line 108, and outputs the output values o(t) ∈ $R^{i+p}$ to signal line 812-1 and the logical values of all signal lines to signal line 812-2.

Step #203 is part of a processing loop, and the following description therefore refers to the time of a process as simply t (where t=0 in the first pass).

Step #203

The data quantity calculation unit 805 calculates equation (9) using the output values o(t) ∈ $R^{i+p}$ output to signal line 812-1, and obtains the data quantity P(t) at time t. This data quantity P(t) is then output to signal line 815. It is to be noted that this process is equivalent to storing the history of the output values o(t) ∈ $R^{i+p}$ at time t in the data quantity.

Step #204

The time of the sequential circuit 1 is updated to t←t+1 by the command output from the clock generator 9 to the signal line 109.

Step #205

This is the step where the actual search for the primary input value maximizing the evaluation value (equation 10) at time t is performed. While the details of this process are described below with reference to FIG. 3, it is important to note here that when Step #205 is completed the optimized primary input u(t) ∈ $R^j$ determined by the search is output to signal line 108, and the calculated result of the output value o(t) ∈ $R^{i+p}$ for that primary input is output to signal line 812-1.

Step #206

It is then determined whether the terminating conditions for test pattern generation are satisfied, specifically whether the number of internal signal lanes not set to both logic 0 and 1 is zero, or whether the preset search end time has been reached. If these conditions are met, the test pattern generation is terminated; if not, the procedure loops back to Step #202.

The specific procedure executed in the input search process (Step #205) is described below with reference to FIGS. 8 and 3. This procedure searches for the primary input maximizing the evaluation value (equation 10) at time t. The search is based on the differential coefficient to the primary input value of the evaluation value.

Step #301

The primary input setting unit 8 defines the initial primary input $u^0(t)$ ∈ $R^j$ as the final primary input u(t−1) ∈ $R^j$ determined one period earlier, and outputs the value to the signal line 108.

Step #302

The evaluation value calculation unit 806 initializes the initial evaluation value $J^{-1}(t)$ to 0.

Step #303 is part of a processing loop, and the following description therefore refers to the number of operations as simply I (where I=0 in the first pass).

Step #303

The analog logic simulator 2 performs an analog logic simulation of the operation of the sequential circuit 1 using the primary input $u^I(0)$ ∈ $R^j$ output to the signal line 108, and outputs the output values o(t) ∈ $R^{i+p}$ to signal line 812-1. All signal line values of the combinational circuit of the sequential circuit 1 are output to signal line 812-2.

Step #304

The evaluation value calculation unit 806 calculates the evaluation value $J^I(t)$ by applying equation (10) to the output values o(t) ∈ $R^{i+p}$ output to signal line 812-1, and the data quantity P(t−1) during the previous period output to signal line 815.

Step #305

The evaluation value calculation unit 806 now compares the evaluation value $J^I(t)$ calculated in Step #304 with the evaluation value $J^{I-1}(t)$ calculated during the previous loop. If the condition new value $J^I(t)$>previous value $J^{I-1}(t)$ is TRUE, the procedure advances to Step #306, otherwise the procedure branches to Step #309.

Step #306

The diffferential calculator 803 calculates the Jacobian matrix for the primary input values of the output values by applying equation (8) using all signal line values output to signal line 812-2. The result of this operation is output to signal line 813.

The evaluation value differential coefficient calculation unit 807 then calculates the evaluation value differential coefficient $\partial J^I(t)/\partial u^I(t)$ by applying equation (11) using the data on signal line 813 and the data quantity P(t−1) output to signal line 815, and the output values o(t) ∈ $R^{i+p}$ output to the signal line 812-1. The result is output to signal line 817. The evaluation value differential coefficient information calculated here indicates the search diction of the input maximizing the evaluation function.

Step #307

The primary input setting unit 8 obtains the next primary input $u^{I+1}(t)$ according to the following rule using the evaluation value differential coefficient $\partial J^I(t)/\partial u^I(t)$ ∈ $R^j$ output to signal line 107. Specifically, the sign of each bit in the evaluation value differential coefficient and the primary input is compared, and if there are any differences, the corresponding bit is inverted in the primary input to generate the next primary input value $u^{I+1}(t)$. This new value is then output to the signal line 108.

As a result, the number of search attempts for the primary input can be reduced because the primary input bits are changed according to the search direction of the input maximizing the evaluation function.

Step #308

The next step is for the primary input setting unit 8 to compare the primary input $u^I(t)$ with the next primary input $u^{I+1}(t)$ obtained in Step #307 to determine if there is any difference in the two strings. If there is, the counter is incremented I←I+1, and the procedure loops back to Step #303. If there is no difference in the value strings, the input search process is terminated.

Step #309

If the value test (new $J^I(t)$>previous $J^{I-1}(t)$) in Step #305 returns FALSE and the procedure branches to Step #309, the primary input setting unit 8 outputs the previous primary input value $u^{I-1}(t)$ to the signal line 108. The analog logic simulator 2 therefore uses the previous primary input value $u^{I-1}(t)$ ∈ $R^j$ output to the signal line 108 to calculate the output values o(t) ∈ $R^{i+p}$, outputs the result to the signal line 812-1, and terminates the input value search process.

The second operating mode of the input search process executed in step 205 is described below with reference to FIGS. 8 and 6. This process searches for the primary input maximizing the evaluation function (equation 10) at time t based on the input values with a Hamming distance close to the initial input value.

Step #601

The primary input setting unit 8 defines the initial primary input $u^0(t)$ ∈ $R^j$ as the final primary input $u(t-1) \in R^j$ determined one period ($t=t-1$) earlier, and outputs the value to the signal line 108.

Step #602 is part of a processing loop, and the following description therefore refers to the number of operations as simply I (where I=0 in the first pass).

Step #602

The analog logic simulator 2 performs an analog logic simulation of the operation of the sequential circuit 1 using the first primary input $u^I(t) \in R^j$ output to the signal line 108, and outputs the output values $o(t) \in R^{i+p}$ to signal line 812-1.

The evaluation value calculation unit 806 calculates the initial evaluation value $J^I(t)$ by applying equation (10) to the output values $o(t) \in R^{i+p}$ output to signal line 812-1, and the data quantity $P(t-1)$ during the previous period output to signal line 815.

Step #603

The primary input setting unit 8 generates j primary input values $u^I{}_L(t) \in R^j (L=1, \ldots, j)$ having a Hamming distance of one from the initial primary input value $u^I(t) \in R^j$. More specifically, the primary input setting unit 8 generates J primary input values for which the L bit sign is inverted.

Step #604

The primary input setting unit 8 outputs one of the j primary input values $u^I{}_L(t) \in R^j$ to the signal line 108. The analog logic simulator 2 performs an analog logic simulation of the operation of the sequential circuit 1 using the primary input values $u^I{}_L(t) \in R^j$ output to the signal line 108, and outputs the output values $o(t) \in R^{i+p}$ to signal line 812-1.

The evaluation value calculation unit 806 calculates the evaluation value $J^I{}_L(t)$ by applying equation (10) to the output values $o(t) \in R^{i+p}$ output to signal line 812-1, and the data quantity $P(t-1)$ during the previous period output to signal line 815.

This operation is performed for each of the different j primary input values.

Step #605

The primary input setting unit 8 compares j evaluation values $J^I{}_L(t)$ and selects the primary input $u^I{}_{max}(t) \in R^j$ corresponding to the maximum evaluation value $J^I{}_{max}(t)$. This maximum primary input $u^I{}_{max}(t) \in R^j$ indicates the optimization direction of the evaluation value from the initial primary input $u^I(t) \in R^j$.

Step #606

The primary input setting unit 8 compares the initial evaluation value $J^I(t)$ with the maximum evaluation value $J^I{}_{max}(t)$. If the condition initial value $J^I(t)$ < maximum value $J^I{}_{max}(t)$ is TRUE, the procedure advances to Step #607, otherwise the procedure branches to Step #608.

Step #607

The primary input setting unit 8 defines the maximum primary input $u^I{}_{max}(t) \in R^j$ as the next initial primary input $u^{I+1}(t) \in R^j$, and outputs the result to the signal lane 108. The counter is then incremented ($I \leftarrow I+1$) before returning to Step #602.

Step #608

The primary input setting unit 8 outputs the initial primary input $u^I(t) \in R^j$ as the final search result $u(t) \in R^j$ to the signal line 108. The analog logic simulator 2 performs an analog logic simulation of the operation of the sequential circuit 1 using the final search result $u(t) \in R^j$ output to the signal lane 108, and outputs the output values $o(t) \in R^{i+p}$ to signal lane 812-1. The input value search process is then terminated.

The benchmark circuit S208 described on pages 1929-1934 of the proceedings of an international symposium on circuits and systems (May 1989) under The Institute of Electrical and Electronics Engineers, Inc., was adapted for use as the sequential circuit 1 for tests. Of the total 115 fault-assumed signal lines, it was possible to set 82 to both logic 0 and logic 1. After careful study of this sequential circuit S208, it was determined that setting the logic values of 82 signal lines was the logical limit due to redundant faults. As a result, the actual fault detection rate was 100%.

As described above, all fault-assumed signal lines can be indirectly set to various logical values by optimizing the evaluation values shown in equation (10) for the primary output values and pseudo-primary output values and setting the output values to various logical values. As a result, the time required to calculate the evaluation values can be significantly reduced compared with the first and second embodiments. In the sequential circuit S208 benchmark tests described above, the calculation time was reduced by approximately fifty times.

It is to be noted that primary input values having a Hamming distance of one from the initial input value are generated in the third embodiment, but proximal primary input values other than those with a Hamming distance of 1 can also be set.

FOURTH EMBODIMENT

The fourth embodiment of a test pattern generating apparatus according to the present invention is described below with reference to the accompanying figures. In this embodiment the primary output values $y(t) \in R^p$ and pseudo-primary output values $x(t+1) \in R^i$ are used as the signal lines being evaluated by the evaluation function, each is stored to a different data quantity, and the evaluation value is a linear sum of the evaluation values based on the respective data quantities.

Figure 9:
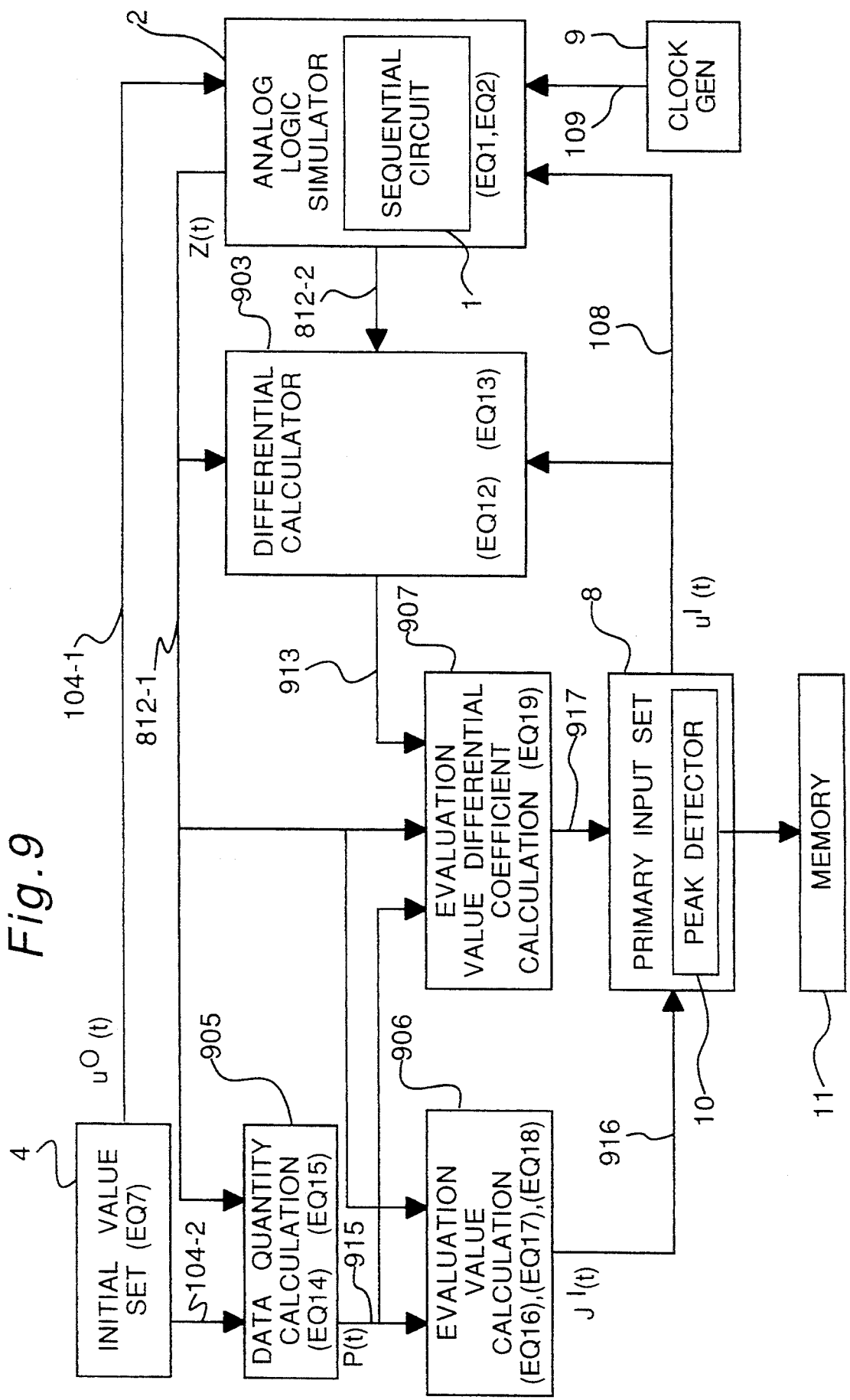
FIG. 9 is a block diagram of a test pattern generating apparatus according to the fourth embodiment of the invention.
Figure 10:
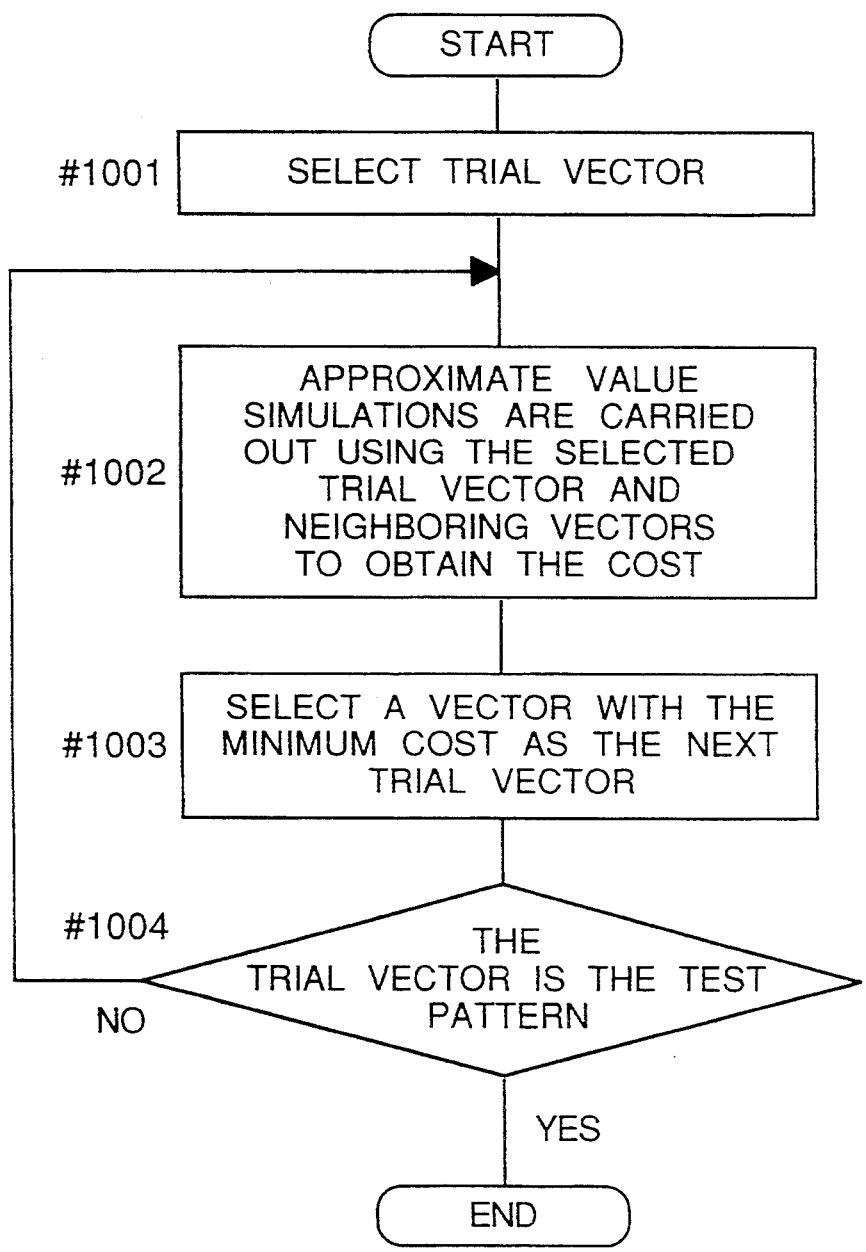
FIG. 10 is a flow chart of the operation of a conventional test pattern generating apparatus.
Figure 11:
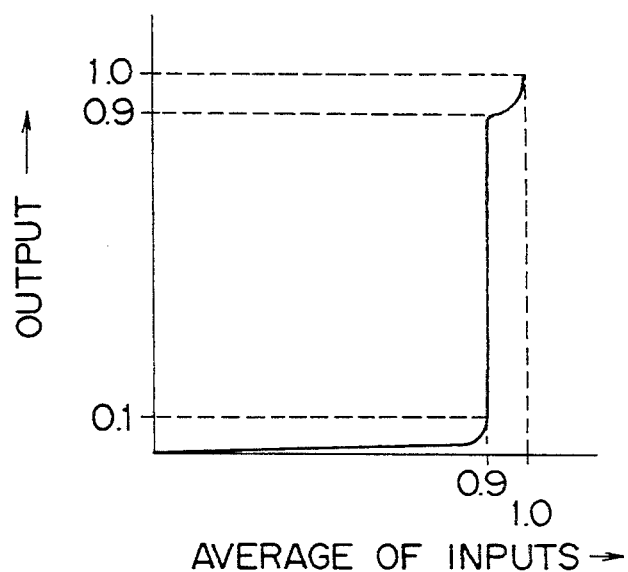
FIG. 11 is a graph of the analog function approximating the AND element in a conventional test pattern generating apparatus.
Figure 12:
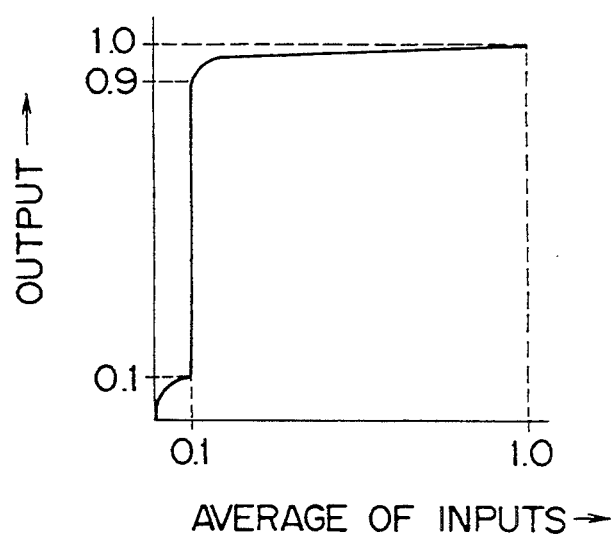
FIG. 12 is a graph of the analog function approximating the OR element in a conventional test pattern generating apparatus.

FIG. 9 is a block diagram of the fourth embodiment of a test pattern generating apparatus according to the invention. For brevity, only the differences between the fourth and third embodiments are described below.

Referring to FIG. 9, this fourth embodiment comprises an analog logic simulator 2 for simulating the sequential circuit 1 in analog logic, outputting the logical values of all signal lines to signal line 812-2, and the primary output values $y(t) \in R^p$ and pseudo-primary output values $x(t+1) \in R^i$ to signal line 812-1.

The differential calculator 903 computes two Jacobian matrices, one for the primary input values $u(t) \in R^j$ of the primary output values $y(t) \in R^p$ (equation 12), and one for the primary output values of the pseudo-primary output values $x(t+1) \in R^i$ (equation 13). It is to be noted that the values of the primary output values $y(t) \in R^p$ and pseudo-primary output values $x(t+1) \in R^i$ in the following description are normalized to one (1).

$$\frac{\partial x(t+1)}{\partial u(t)} = \left[\frac{\partial x_m(t+1)}{\partial u_n(t)}\right] \quad (12)$$

where $1 \leq m \leq p$, $1 \leq n \leq j$ $$\frac{\partial y(t)}{\partial u(t)} = \left[\frac{\partial y_m(t)}{\partial u_n(t)}\right] \quad (13)$$

where $1 \leq m \leq i$, $1 \leq n \leq j$

The data quantity calculation unit 905 calculated the data quantities P__J(t) and P__S(t) defined by the inverse covariance matrices of the primary output values y(t) ∈ $R^p$ and pseudo-primary output values x(t+1) ∈ $R^i$ by applying equations (14) and (15), respectively.

$$P\_O(t) = P\_O(t-1) - \frac{P\_O(t-1)y(t)y^t(t)}{1+y^t(t)P\_O(t-1)y(t)} P\_O(t-1) \quad (14)$$

$$P\_S(t) = P\_S(t-1) - \quad (15)$$

$$\frac{P\_S(t-1)x(t+1)x^t(t+1)}{1+x^t(t+1)P\_S(t-1)x(t+1)} P\_S(t-1)$$

The evaluation value calculation unit 906 then calculates the evaluation value J__O(t) as defined by equation (16) from the data quantity P__O(t−1) and the primary output values y(t) ∈ $R^p$, calculates the evaluation value J__S(t) as defined by equation (17) from the data quantity P__S(t−1) and the pseudo-primary output values x(t+1) ∈ R, and obtains the evaluation value as the linear sum of these two evaluation values as shown in equation (18). This resulting evaluation value J(t) is then output to signal line 916.

$$J\_O(t) = y^t(t)P\_O(t-1)y(t) \quad (16)$$

$$J\_S(t) = x^t(t+1)P\_S(t-1)x(t+1) \quad (17)$$

$$J(t) = J\_O(t) + a^* J\_S(t) \quad (18)$$

Thus, equation (16) is to calculate the evaluation value based on the primary outputs from the sequential circuit, equation (17) is to calculate the evaluation value based on inputs from the memory elements, such as flip-flops, in the sequential circuit, and equation (18) is to calculate a linear sum of the two evaluation values obtained from equations (16) and (17).

The evaluation value differential coefficient calculation unit 907 calculates the differential coefficients $\partial J(t)/\partial u(t) \in R^j$ for the primary inputs u(t) ∈ $R^j$ of the evaluation values J(t) by applying (19). The result is then output to signal line 917.

$$\frac{\partial J(t)}{\partial u(t)} = \quad (19)$$

$$2y(t)^t P\_O(t-1) \frac{\partial y(t)}{\partial u(t)} + a^* 2x(t+1)^t P\_S(t-1) \frac{\partial x(t+1)}{\partial u(t)}$$

The operation is essentially identical to that of the third embodiment above, and the essential differences only are described below.

Like the third embodiment, this fourth embodiment has two operating modes: using the differential coefficient to the primary input of the evaluation value for searching the primary inputs, and using information on the evaluation values of the primary inputs that differ from the initial input by a Hamming distance of 1. This fourth embodiment differs from the third in the methods of calculating the data quantity, calculating the evaluation values, and calculating the differential coefficients to the primary input values of the evaluation values. The process flow is identical in both embodiments.

The benchmark tests were performed using the sequential circuit S208 as described in the third embodiment above. Of the total 115 fault-assumed signal lines, it was possible to set 82 to both logic 0 and logic 1. As described above, this is equivalent to an actual fault detection rate of 100%.

As described above, all fault-assumed signal lines can be indirectly set to various logical values by optimizing the evaluation values shown in equation (18) for the primary output values and pseudo-primary output values and setting the output values to various logical values. At the same time, optimizing J__S(t) is equivalent to setting the pseudo-primary output values x(t+1) to various logical values, and has the effect of actively inducing state transitions. In general, it is necessary to set the logical values of internal logic elements in order to set the signal lines of the sequential circuit to the various logical values, and the present invention provides an efficient means of generating the requisite test pattern. In addition, the evaluation values (equation 18) of this fourth embodiment have a calculation quantity on the order of only ($p^2 + i^2$), making it possible to greatly reduce the calculation quantity.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A test pattern generating apparatus for generating test patterns for testing a sequential circuit having at least one memory element, at least one logic element and a plurality of signal lines, said test pattern generating apparatus comprising:

an analog logic values calculation means for calculating, in response to a primary input applied to the sequential circuit, an analog logic values of the signal lines in the sequential circuit by a nonlinear function;

a data quantity calculation means for storing a history data of the analog logic values of the signal lines with an inverse covariance matrix of the analog logic values;

an evaluation value calculation means for receiving said history data from said data quantity calculation means for calculating an evaluation value according to a degree of variance between the analog logic values and the history data;

a primary input setting means for receiving said evaluation value from said evaluation value calculation means and for producing a next primary input which provides a maximum evaluation value from the evaluation value obtained from the applied primary input; and a memory means for sequentially storing the next primary input produced by said primary input setting means, whereby the next primary input stored in said memory means serves as a test pattern.

2. A test pattern generating apparatus as claimed in claim 1, further comprising:
   a differential calculation means for calculating a differential value of every signal lines in the sequential circuit; and
   an evaluation value differential coefficient calculation means for receiving said history data from said data quantity calculation means, said differential value from said differential calculation means and said analog logic value from said analog logic value calculation means for calculating a differential coefficient indicative of a search direction of the primary input maximizing the evaluation value in response to each application of primary input;
   said primary input setting means producing a number of entries of primary inputs each based on a respective differential coefficient and selecting one entry which produces a maximum evaluation value from the evaluation values obtained in a previous cycle.

3. A test pattern generating apparatus as claimed in claim 1, wherein said primary input setting means produces a number of primary inputs which differ from the previous primary input by a Hamming distance of 1, and selects one primary input which produces a maximum evaluation value from the evaluation value obtained in a previous cycle.

4. A test pattern generating apparatus as claimed in claim 1, wherein the analog logic value calculation means uses a monotone increasing function as the non-linear function for obtaining analog logic values.

5. A test pattern generating apparatus as claimed in claim 1, wherein each of the data quantity calculation means and evaluation value calculation means receives the analog logic values from all the signal lines in the sequential circuit.

6. A test pattern generating apparatus as claimed in claim 1, wherein each of the data quantity calculation means and evaluation value calculation means receives the analog logic values from input signal lines of the memory element as pseudo-primary outputs and from primary output lines of the sequential circuit as primary outputs.

* * * * *

UNITED STATES PATENT AND TRADEMARK OFFICE
CERTIFICATE OF CORRECTION

PATENT NO.    : 5,434,869
DATED         : July 18, 1995
INVENTOR(S)   : Maekawa et al.

It is certified that error appears in the above-identified patent and that said Letters Patent is hereby corrected as shown below:

On the Cover Page, in the Abstract (item 57), line 14, after "input." insert --A memory is included for sequentially storing the primary--.

Signed and Sealed this

Second Day of January, 1996

Attest:

BRUCE LEHMAN

*Attesting Officer*    *Commissioner of Patents and Trademarks*